United States Patent
Nazarian et al.

(10) Patent No.: US 9,685,483 B2
(45) Date of Patent: Jun. 20, 2017

(54) SELECTOR-BASED NON-VOLATILE CELL FABRICATION UTILIZING IC-FOUNDRY COMPATIBLE PROCESS

(71) Applicant: Crossbar, Inc., Santa Clara, CA (US)

(72) Inventors: Hagop Nazarian, San Jose, CA (US); Sung Hyun Jo, Sunnyvale, CA (US); Harry Yue Gee, Milpitas, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/066,504

(22) Filed: Mar. 10, 2016

(65) Prior Publication Data

US 2016/0190208 A1 Jun. 30, 2016

Related U.S. Application Data

(63) Continuation-in-part of application No. 14/717,185, filed on May 20, 2015, now Pat. No. 9,460,788.
(Continued)

(30) Foreign Application Priority Data

Jul. 8, 2015 (TW) .................................. 104122122

(51) Int. Cl.
*H01L 45/00* (2006.01)
*H01L 27/24* (2006.01)
(Continued)

(52) U.S. Cl.
CPC ........ *H01L 27/2436* (2013.01); *G11C 13/003* (2013.01); *G11C 13/004* (2013.01);
(Continued)

(58) Field of Classification Search
CPC ... H01L 27/2436; H01L 45/16; G11C 13/003; G11C 13/004; G11C 13/0069
See application file for complete search history.

(56) References Cited

U.S. PATENT DOCUMENTS 6,849,891 B1 2/2005 Hsu et al.
6,855,975 B2 2/2005 Gilton
(Continued)

FOREIGN PATENT DOCUMENTS

CN 1506972 A 6/2004
CN 101501850 A 8/2009
(Continued)

OTHER PUBLICATIONS

Office Action dated Dec. 6, 2013 for U.S. Appl. No. 13/960,735, 19 pages.
(Continued)

*Primary Examiner* — Allison P Bernstein
(74) *Attorney, Agent, or Firm* — Amin, Turocy & Watson, LLP

(57) ABSTRACT

A circuit operable as a non-volatile memory cell, formed in part from a volatile selection device, is provided. The circuit can be fabricated utilizing Integrated Circuit (IC)-Foundry compatible processes to simplify manufacturing, reduce cost and improve yield. For instance, the circuit can comprise a set of transistors fabricated at least in part with front-end-of-line IC processes, and can comprise the volatile selection device and a set of interconnects fabricated at least in part with back-end-of-line IC processes. In further embodiments, the volatile selection device can be a two-terminal, volatile resistive-switching device connected at one end to a gate of an n-well transistor, and connected at a second end to a gate of a p-well transistor.

20 Claims, 15 Drawing Sheets

Related U.S. Application Data which is a continuation-in-part of application No. 14/726,071, filed on May 29, 2015.

(60) Provisional application No. 62/022,594, filed on Jul. 9, 2014.

(51) Int. Cl.
*G11C 13/00* (2006.01)
*G11C 14/00* (2006.01)

(52) U.S. Cl.
CPC .......... *G11C 13/0069* (2013.01); *G11C 14/00* (2013.01); *G11C 14/0045* (2013.01); *H01L 45/145* (2013.01); *H01L 45/16* (2013.01); *G11C 2213/53* (2013.01); *G11C 2213/79* (2013.01)

(56) References Cited

U.S. PATENT DOCUMENTS

| | | | |
|---|---|---|---|
| 7,176,530 B1 | 2/2007 | Bulucea et al. | |
| 7,187,577 B1 | 3/2007 | Wang et al. | |
| 7,274,064 B2 | 9/2007 | Bertin et al. | |
| 7,280,390 B2 | 10/2007 | Kostylev et al. | |
| 7,368,752 B2 | 5/2008 | Luyken et al. | |
| 7,388,775 B2 | 6/2008 | Bedeschi et al. | |
| 7,579,612 B2 | 8/2009 | Tang et al. | |
| 7,704,788 B2 | 4/2010 | Youn et al. | |
| 7,786,464 B2 | 8/2010 | Nirschl et al. | |
| 7,791,060 B2 | 9/2010 | Aochi et al. | |
| 7,829,875 B2 | 11/2010 | Scheuerlein | |
| 7,830,698 B2 | 11/2010 | Chen et al. | |
| 7,835,174 B2 | 11/2010 | Tokiwa | |
| 7,859,884 B2 | 12/2010 | Scheuerlein | |
| 7,881,097 B2 | 2/2011 | Hosomi et al. | |
| 7,897,953 B2 | 3/2011 | Liu | |
| 7,920,412 B2 | 4/2011 | Hosotani et al. | |
| 7,924,138 B2 | 4/2011 | Kinoshita et al. | |
| 7,961,506 B2 | 6/2011 | Liu | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,067,815 B2 | 11/2011 | Chien et al. | |
| 8,102,698 B2 | 1/2012 | Scheuerlein | |
| 8,164,948 B2 | 4/2012 | Kattie et al. | |
| 8,218,350 B2 | 7/2012 | Kozicki | |
| 8,278,170 B2 | 10/2012 | Lee et al. | |
| 8,320,160 B2* | 11/2012 | Nazarian ............ G11C 13/0007 365/148 | |
| 8,329,537 B2 | 12/2012 | Kim et al. | |
| 8,351,241 B2 | 1/2013 | Lu et al. | |
| 8,369,139 B2 | 2/2013 | Liu et al. | |
| 8,411,485 B2* | 4/2013 | Nazarian ............ G11C 14/0045 365/148 | |
| 8,502,185 B2 | 8/2013 | Lu et al. | |
| 8,587,050 B2 | 11/2013 | Ohba | |
| 8,659,933 B2 | 2/2014 | Jo | |
| 8,735,247 B2 | 5/2014 | Yoo et al. | |
| 8,767,441 B2 | 7/2014 | Lu et al. | |
| 8,993,397 B2 | 3/2015 | Herner | |
| 9,023,719 B2 | 5/2015 | Pachamuthu et al. | |
| 9,305,624 B2 | 4/2016 | Shepard | |
| 2004/0170040 A1 | 9/2004 | Rinerson et al. | |
| 2006/0097238 A1 | 5/2006 | Breuil et al. | |
| 2006/0231910 A1 | 10/2006 | Hsieh et al. | |
| 2007/0268744 A1 | 11/2007 | Taguchi | |
| 2008/0192531 A1 | 8/2008 | Tamura et al. | |
| 2009/0014707 A1 | 1/2009 | Lu et al. | |
| 2009/0122592 A1 | 5/2009 | Tokiwa | |
| 2009/0231910 A1 | 9/2009 | Liu et al. | |
| 2010/0124093 A1 | 5/2010 | Shiga et al. | |
| 2010/0157656 A1 | 6/2010 | Tsuchida | |
| 2010/0176367 A1 | 7/2010 | Liu | |
| 2010/0237314 A1 | 9/2010 | Tsukamoto et al. | |
| 2010/0243983 A1 | 9/2010 | Chiang et al. | |
| 2010/0252909 A1 | 10/2010 | Nakanishi et al. | |
| 2011/0033967 A1 | 2/2011 | Lutz et al. | |
| 2011/0089391 A1 | 4/2011 | Mihnea et al. | |
| 2011/0149639 A1 | 6/2011 | Carter et al. | |
| 2011/0305065 A1 | 12/2011 | Nazarian et al. | |
| 2011/0310656 A1 | 12/2011 | Kreupl et al. | |
| 2011/0317470 A1 | 12/2011 | Lu et al. | |
| 2012/0007035 A1 | 1/2012 | Jo et al. | |
| 2012/0044751 A1 | 2/2012 | Wang et al. | |
| 2012/0112156 A1 | 5/2012 | Park et al. | |
| 2012/0122290 A1 | 5/2012 | Nagashima | |
| 2012/0132971 A1 | 5/2012 | Mikasa | |
| 2012/0176831 A1 | 7/2012 | Xiao et al. | |
| 2012/0187410 A1 | 7/2012 | Yamazaki et al. | |
| 2012/0211719 A1 | 8/2012 | Haimoto et al. | |
| 2012/0236650 A1 | 9/2012 | Nazarian | |
| 2012/0250395 A1 | 10/2012 | Nodin | |
| 2012/0305879 A1 | 12/2012 | Lu et al. | |
| 2012/0314472 A1 | 12/2012 | Chung | |
| 2013/0264534 A1 | 10/2013 | Hwang et al. | |
| 2013/0313508 A1 | 11/2013 | Kawasaki | |
| 2013/0334593 A1 | 12/2013 | Seol et al. | |
| 2014/0063903 A1 | 3/2014 | Chang et al. | |
| 2014/0092669 A1 | 4/2014 | Chen et al. | |
| 2014/0112058 A1 | 4/2014 | Kellam et al. | |
| 2014/0231740 A1 | 8/2014 | Ohba | |
| 2014/0284544 A1 | 9/2014 | Miyagawa et al. | |
| 2014/0292365 A1 | 10/2014 | Said | |
| 2015/0070966 A1 | 3/2015 | Bandyopadhyay et al. | |
| 2015/0076579 A1 | 3/2015 | Tsuji et al. | |
| 2015/0179662 A1 | 6/2015 | Makala et al. | |
| 2016/0104715 A1 | 4/2016 | Pachamuthu et al. | |
| 2016/0204117 A1 | 7/2016 | Liu et al. | |
| 2016/0211386 A1 | 7/2016 | Tomai et al. | |
| 2016/0268341 A1* | 9/2016 | Nazarian ............ H01L 27/2463 | |

FOREIGN PATENT DOCUMENTS

| | | |
|---|---|---|
| CN | 102986048 A | 3/2013 |
| CN | 103682091 A | 3/2014 |
| JP | 2001249324 A | 9/2001 |
| JP | 2008277543 A | 11/2008 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 A | 2/2011 |
| JP | 2011129639 A | 6/2011 |
| JP | 2014036034 A | 2/2014 |
| TW | 201214673 A | 4/2012 |
| WO | 2011005266 A1 | 1/2011 |
| WO | 2013052321 A2 | 4/2013 |

OTHER PUBLICATIONS

Office Action dated Mar. 17, 2015 for U.S. Appl. No. 14/573,770, 19 pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
Office Action dated Jun. 19, 2012 for U.S. Appl. No. 13/149,757, 11 pages.
International Search Report and Written Opinion for PCT Application No. PCT/US2015/17370 mailed Jul. 13, 2015, 17 pages.
Office Action dated Oct. 3, 2013 for U.S. Appl. No. 13/921,157, 10 pages.
International Search Report and Written Opinion for PCT Application No. PCT/US2012/040232 mailed Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.

(56) References Cited

OTHER PUBLICATIONS

Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 mailed Dec. 16, 2013, 9 pages.
Notice of Allowance dated Jul. 22, 2015 for U.S. Appl. No. 14/612,025, 11 pages.
Chinese Office Action (with English translation) dated Nov. 23, 2015 for Chinese Patent Application No. 201280027066.9, 12 pages.
Office Action dated Aug. 3, 2015 for U.S. Appl. No. 14/717,185, 26 Pages.
Ex Parte Quayle Office Action dated Aug. 18, 2016 for U.S. Appl. No. 14/795,105, 13 pages.
Japanese Office Action dated Aug. 2, 2016 for Japanese Application No. 2015-102280, 13 pages.
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Taiwanese Office Action dated Aug. 11, 2016 for Taiwanese Application No. 104121989, 10 pages (including translation).
Taiwanese Office Action dated Oct. 19, 2016 for Taiwanese Application No. 104122122, 7 pages (including translation).
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Dec. 22, 2016 for U.S. Appl. No. 14/641,466, 45 pages.
Office Action dated Dec. 29, 2016 for U.S. Appl. No. 15/195,417, 38 pages.
Office Action dated Jul. 14, 2016 for U.S. Appl. No. 14/793,392, 28 pages.
Office Action dated Jul. 13, 2016 for U.S. Appl. No. 14/755,998, 22 pages.
Office Action dated Jul. 6, 2016 for U.S. Appl. No. 14/726,071, 25 pages.
Chinese Office Action dated Dec. 27, 2016 for Chinese Patent Application No. 201510105630.X, 16 pages (including English translation).
Japanese Office Action dated Mar. 7, 2017 for Japanese Application Serial No. JP2015-102280, 6 pages (including English translation).
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Office Action dated Mar. 30, 2017 for U.S. Appl. No. 14/726,071, 64 pages.

\* cited by examiner

SELECTOR-BASED NON-VOLATILE CELL FABRICATION UTILIZING IC-FOUNDRY COMPATIBLE PROCESS

REFERENCE TO RELATED APPLICATIONS

The present application for patent is a continuation-in-part of U.S. patent application Ser. No. 14/717,185 entitled "NON-VOLATILE MEMORY CELL UTILIZING VOLATILE SWITCHING TWO TERMINAL DEVICE AND A MOS TRANSISTOR" and filed May 20, 2015, which claims the benefit of U.S. Provisional Patent Application Ser. No. 62/022,594 entitled "NON-VOLATILE MEMORY CELL UTILIZING VOLATILE SWITCHING TWO TERMINAL DEVICE AND A MOS TRANSISTOR" and filed Jul. 9, 2014 and is a continuation-in-part of U.S. patent application Ser. No. 14/726,071 entitled "RECESSED HIGH VOLTAGE METAL OXIDE SEMICONDUCTOR TRANSISTOR FOR RRAM CELL" and filed May 29, 2015; this application claims priority under 35 U.S.C. §119 to Taiwanese Patent Application No. 104122122, filed Jul. 8, 2015— which claims priority to U.S. patent application Ser. No. 14/717,185 filed May 20, 2015, which claims the benefit of U.S. Provisional Application No. 62/022,594 filed Jul. 9, 2014; the disclosures of the foregoing applications are incorporated herein by reference in their respective entireties and for all purposes.

INCORPORATION BY REFERENCE

U.S. Non-Provisional patent application Ser. No. 14/588,185, entitled "Selector Device for Two-Terminal Memory" and filed Dec. 31, 2014, U.S. Non-Provisional patent application Ser. No. 14/726,071, entitled "Recessed High Voltage Metal Oxide Semiconductor Transistor for RRAM Cell" and filed May 29, 2015, U.S. Non-Provisional application Ser. No. 11/875,541 filed Oct. 19, 2007 and U.S. Non-Provisional application Ser. No. 12/575,921 filed Oct. 8, 2009, are hereby incorporated by reference herein in their respective entireties and for all purposes.

TECHNICAL FIELD

The subject disclosure relates generally to non-volatile memory, and as one illustrative example, a non-volatile memory cell utilizing a volatile resistive switching device and MOS transistor.

BACKGROUND

The inventors of the present disclosure have proposed models of two-terminal memory devices that they expect to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventors to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fabrication-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The present application relates to a circuit operable as a non-volatile memory cell, formed in part from a volatile selection device, and methods for fabricating the circuit. In various embodiments, the circuit can be fabricated utilizing Integrated Circuit (IC)-Foundry compatible processes. For instance, in at least one embodiment, the circuit can comprise a set of transistors fabricated at least in part with front-end-of-line IC processes, and can comprise the volatile selection device and a set of interconnects fabricated at least in part with back-end-of-line IC processes. In further embodiments, the volatile selection device can be a two-terminal, volatile resistive-switching device connected at one end to a gate of an n-well transistor, and connected at a second end to a gate of a p-well transistor.

In further embodiments, the subject disclosure provides a method of fabricating a non-volatile memory device. The method can comprise forming a first transistor and a second transistor in a substrate and forming conductive interconnects as a backend-of-line (BEoL) process overlying the substrate. Forming the conductive interconnects can further comprise: forming a first of the conductive interconnects having a first end thereof in electrical contact with a first gate of the first transistor and forming a second of the conductive interconnects having a first end thereof in electrical contact with a second gate of the second transistor. Moreover, the method can comprise forming a volatile, resistive-switching selection device connected to a second end of the first of the conductive interconnects. In addition, the method can comprise forming a contact connected to a second end of the second of the conductive interconnects and forming a metal layer overlying and in electrical contact with both the volatile selection device and the contact.

In alternative or additional embodiments a non-volatile memory is disclosed. The non-volatile memory can comprise a first three-terminal transistor having a source, a drain and a gate formed in a substrate or a dielectric of the non-volatile memory. Additionally, the non-volatile memory can comprise a volatile selection device having a first terminal, a second terminal and a selection layer, wherein the first terminal is connected electrically in serial to the gate of the first three-terminal transistor. Further, the non-volatile memory can comprise a second three-terminal transistor having a second source, a second drain and a second gate, wherein the second terminal of the volatile selection device is connected to the second gate of the second three-terminal transistor.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
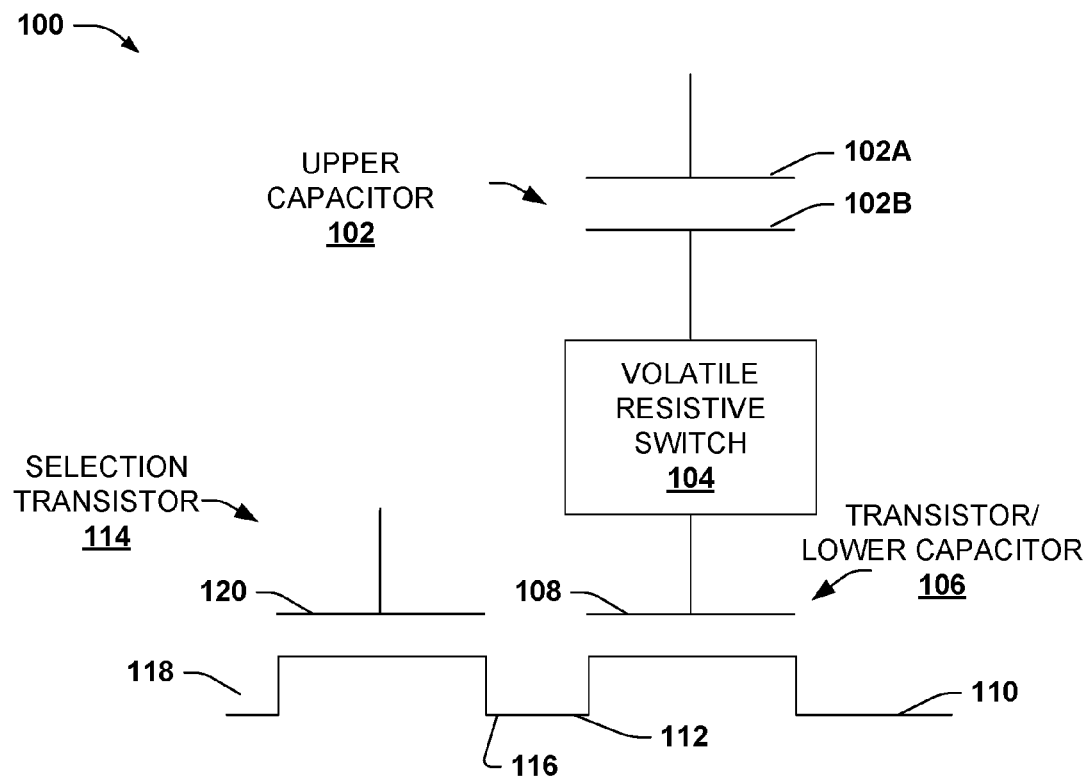
FIG. 1 illustrates a schematic diagram of an example circuit for a non-volatile memory cell according to embodiments of the present disclosure.

This disclosure relates to a non-volatile memory device comprising one or more volatile elements. In some embodiments, the non-volatile memory device can include a resistive two-terminal selector device that can be in a low resistive state or a high resistive state in response to respective voltages, or respective ranges of voltages, applied to the resistive two-terminal selector device. The selector device can be a volatile switching device with multiple thresholds (or narrow threshold ranges) (e.g., a positive threshold and a negative threshold). In various embodiments, the selector device is a resistive switching device, or a field induced superlinear threshold (FAST™) switching device (or selector device) under development by the assignee of the present invention. In addition to the resistive two-terminal selector device, the non-volatile memory device can include a capacitor structure and a MOS ("metal-oxide-semiconductor") transistor (which can act or operate as an additional capacitor, in at least some disclosed embodiments). The capacitor can be a PMOS transistor in one or more embodiments, and in other embodiments can be a metal-insulator-metal capacitor, although other suitable capacitors can be employed. A first terminal of the capacitor can be coupled to a voltage source, and the second terminal of the capacitor can be coupled to a first selector terminal of the selector device. In one or more embodiments, the MOS transistor can be an NMOS transistor comprising a floating gate connected to a second selector terminal of the selector device. Electrical conductivity between a source and drain of the NMOS transistor is modulated by a charge magnitude stored on the MOS transistor gate which is floating (e.g., typically not connected to a power source) during read operation. In some embodiments, the NMOS transistor can be a deep trench transistor having a low profile gate, reducing substrate surface area consumed by the non-volatile memory device. In one or more additional embodiments a second NMOS transistor can be provided having a source or drain connected in series with the source/drain of the first NMOS transistor, as discussed herein.

In various embodiments, a disclosed volatile selector device (volatile resistive switch) can be a filamentary-based device. One example of a filamentary-based device can comprise: a first conductive layer (e.g., a metal bearing layer such as TiN, TaN, Cu, Al, Ag, or alloy thereof (the alloy including, e.g. Cu, Al, Ag, Mn, Mg, Si, Zn, N, etc.), a doped semiconductor layer, etc.); a resistive switching layer (RSL) having relatively few particle-trapping defect sites (e.g., an undoped a-Si, a non-stochastic material, e.g. a silicon sub-oxide ($SiO_x$ where x is within a range from about 0.1 to about 2.0, a silicon sub-oxynitride, a silicon sub-nitride, a metal nitride (e.g. aluminum nitride or sub-nitride, etc.)); and a second conductive layer (e.g. a material selected from the list described for the first conductive layer).

Under suitable bias conditions, conductive ions form within the first conductive layer, and the first conductive layer provides the conductive ions to the RSL, e.g. the conductive ions diffuse into the RSL. In various embodiments, a bias may be an applied voltage exceeding a magnitude of a threshold voltage (e.g. an applied voltage exceeding a positive threshold voltage, an applied voltage smaller than a negative threshold voltage). In various embodiments, after the bias exceeds the positive threshold voltage, the conductive ions remain diffused within the RSL so long as the bias exceeds a magnitude of a hold voltage (that may be smaller than the magnitude of the threshold voltage). For example, a threshold voltage may be 1.1 volts, and a hold voltage may be 0.5 volts. In various embodiments, after the bias exceeds the hold voltage, so long as the bias exceeds the hold voltage, the conductive ions form a conductive channel through the select material.

In some embodiments, in the absence of the bias above the hold voltage or the threshold voltage, the conductive filament can at least in part deform, breaking electrical continuity of the conductive filament within the RSL. This can result from a surface energy of the metal particles exceeding stabilizing influences keeping the particles in place (e.g., surface tension of surrounding molecules, voids/defects/trapping sites within the RSL, an ionizing electric field, etc.) resulting in particle diffusion within the RSL. This particle diffusion can facilitate a break in electrical continuity of the conductive filament, restoring the RSL to an intrinsic high resistance state. In some embodiments, as the bias falls below the hold voltage, e.g. bias is 0 volts, conductive ions may at least partially diffuse back out of the RSL. The conductive ions typically revert to neutral conductive metal particles upon absence of the external bias. In various embodiments, few neutral conductive metal particles are trapped within the RSL upon absence of the bias, because the RSL has a low number of crystalline defects. In absence of the conductive channel, the resistance of the RSL has a much higher resistance than the resistance of the RSL under bias (with the conductive channel). A ratio between resistances of the RSL can range from 10E7 to 10E9 and sometimes greater.

According to further embodiments, the second conductive layer can also comprise neutral metal particles capable of being ionized. In such embodiments, the second conductive layer can form metal ions and provide the metal ions to the RSL in response to a second suitable bias condition(s), in a similar manner as described above. In some embodiments, the threshold voltage for the first conductive layer to ionize and the threshold voltage for the second conductor layer to ionize may be similar or different, according to engineering design factors. The polarities of these threshold voltages are typically opposite of each other.

A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a non-zero value less than 2), a silicon oxynitride, a silicon sub-oxynitride, a silicon nitride, a silicon sub-nitride, a metal nitride (e.g. aluminum nitride or sub-nitride) and so forth. Other examples of materials suitable for the RSL could include $Si_X Ge_Y O_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stoichiometric silicon-bearing material, a non-stoichiometric metal oxide, a metal nitride (e.g. an aluminium nitride or sub-nitride), and so forth, or a suitable combination thereof. In various embodiments, the RSL includes few or a low number of material voids or defects (e.g. crystalline) which can trap conductive particles; accordingly, in some embodiments, the conductive particles have relatively good diffusive or drift mobility within the RSL, or can quickly form a very narrow conductive filament in response to a suitable threshold bias, or a combination of the foregoing.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, a volatile switching device, a volatile two-terminal switching device, a volatile resistance-switching device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a FAST™ selector device under development by the current assignee is to be used.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In some embodiments, two unipolar devices may be placed in parallel, with opposite polarity. It is expected that such a configuration of unipolar devices would provide a characteristic response similar to the bipolar selector device, described above.

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL, formation of a very narrow (e.g., only a few particles wide, or less) conductive filament, or the like, or a combination of the foregoing. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains (or forms) the metallic particles in sufficient formation to provide the conductive path, leading to relatively low resistance of the second state. An analogous mechanism can control operation of the third state (in a reverse direction and reverse polarity stimulus) in the bipolar context.

Overview

The volatile element of disclosed non-volatile memory cells, the selector device, can have a low resistance state and a high resistance state based on the voltage being applied by the voltage source to the first terminal of the capacitor. Between a range of deactivation voltages (e.g., from a negative threshold voltage to a positive threshold voltage, or other suitable positive range, negative range, or range spanning positive and negative voltages) the resistance can be very high, whereas outside the range of deactivation voltages, the resistance can be much lower, facilitating current flow (and charge transfer) across the selector device. As a magnitude of voltage across the selector device, starting within the range of deactivation voltages, is increased (e.g., increasing with time), charge first accumulates very slowly on the gate of the MOS transistor connected to a second terminal of the selector device. Once the magnitude of the voltage leaves the range of deactivation voltages and exceeds a first threshold voltage (e.g., a positive threshold, or a narrow range of positive threshold voltages), the selector device enters the low resistance state and conducts current to the gate of the MOS transistor, enabling charge to accumulate much more quickly on the gate of the MOS transistor. As the voltage decreases below the positive threshold (or narrow range of positive threshold voltages), the selector device enters the high resistance state and becomes non-conductive. The non-conductivity of the selector device serves to trap charge that accumulated at the gate of the MOS transistor, as stated above. When the voltage source returns to zero, for example, the charge trapped at the gate of the MOS transistor can still remain, resulting in a measurable potential difference greater than zero (e.g., about 0.5 volts, about 0.75 volts, about 1 volt, or any other suitable voltage measurably distinct from zero). This trapped measurable charge can cause the MOS transistor to be in a second state, different from a first state in which less charge is trapped at the gate of the MOS transistor (e.g. first state: non-conducting, second state: conducting). The two states of the MOS transistor provide a bit of non-volatile storage.

In an erase cycle, a decreasing negative voltage is applied, and while the selector device is in a high resistance state, charge at the gate of the MOS transistor decreases slowly. Once the selector device switches to the low resistance state, the charge decreases more rapidly with decreasing negative voltage. The selector device switching to the low resistance state occurs when the decreasing negative voltage again leaves the range of deactivation voltages (e.g., drops below a negative threshold voltage, or narrow range of negative threshold voltages). The positive charge stored at the gate of the MOS transistor generated by the positive voltage (described above) decreases rapidly (e.g., the amount of positive charges is reduced, the gate stores a negative charge, or the like in various embodiments) and changes a state of the MOS transistor from the second state back to the first state (e.g. from conducting to non-conducting state). In some embodiments, negative charge accumulates quickly with the selector device in the low resistance state, and then as the applied voltage returns to zero and the selector device returns to the high resistant state, a negative charge remains accumulated on the gate of the MOS transistor. Since the current leakage of the selector device can be very low (e.g., measured in atto-amps in at least some disclosed embodiments), the charge on the gate of the MOS transistor can retain a magnitude suitable to maintain the changed state of the MOS transistor for a long period of time. These two different stable states of positive charge and negative charge accumulation on the gate of the MOS transistor provide non-volatile characteristics for the disclosed memory cells.

Non-Limiting Examples of a Selector-Based, Non-Volatile Cell and IC-Foundry Compatible Processes Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1 illustrated is a schematic diagram of an example non-volatile memory cell 100 with a volatile element in accordance with various aspects described herein. Non-volatile memory cell 100 can include a volatile resistive switch 104 (e.g., a volatile resistive-switching two-terminal device, selector device) that can be in a low resistive state or a high resistive state depending on the voltage being applied. A capacitor 102 with a first terminal 102A and a second terminal 102B connected to the volatile resistive switch 104 can also be provided. A first MOS transistor 106 (e.g., an NMOS transistor, or other suitable MOS transistor) can serve as a lower capacitor for non-volatile memory cell 100. First MOS transistor 106 can comprise a gate 108 connected to the volatile resistive switch 104, a source 110, and a drain 112. In an embodiment, the drain 112 can also be connected in series with a source 116 of a selection transistor 114 that includes a gate 120, the source 116 and a drain 118. In an embodiment, selection transistor 114 or first MOS transistor 106 can be a deep trench transistor having a low-profile gate, facilitating higher transistor densities for first MOS transistor 106 or selection transistor 114. As an example, a deep trench transistor device 302 of FIG. 3, infra, could be utilized for selection transistor 114 or first MOS transistor 106 (or other transistors disclosed herein), in various embodiments.

Volatile resistive switch 104 can be a resistive two-terminal selector device configured to be operable in response to a suitable electric signal applied at one or more of two terminals of volatile resistive switch 104. In various disclosed embodiments, volatile resistive switch 104 can have a non-linear I-V response, in which volatile resistive switch 104 exhibits current within a first range in response to a first range of voltage magnitudes, and current within a second range (e.g., much higher in magnitude than the first range) in response to a second range(s) of voltage magnitudes. The first range of voltage magnitudes and second range(s) of voltage magnitudes can be distinguished, as one example, by a threshold voltage(s), or a threshold range of voltages (e.g., having magnitude(s) between the first range of voltage magnitudes and the second range(s) of voltage magnitudes). In various embodiments, volatile resistive switch 104 may be embodied as a FAST™ selector device, currently under development by the current assignee of the present patent application and disclosed in U.S. Non-Provisional application Ser. No. 14/588,185 filed Dec. 31, 2014, the entirety of which is incorporated by reference herein for all purposes.

In some embodiments, the second range(s) of voltage magnitudes can include a positive subset of voltage magnitudes and a negative subset of voltage magnitudes. In such embodiments, the positive subset of voltage magnitudes represents positive voltages for which volatile resistive switch 104 exhibits current within the second range, and the negative subset of voltage magnitudes represents negative voltages for which volatile resistive switch 104 exhibits current within the second range. In some embodiments, the positive subset of voltage magnitudes can be the same or substantially the same (in magnitude) as the negative subset of voltage magnitudes. In other embodiments, the positive subset of voltage magnitudes can at least in part differ (in magnitude) from the negative subset of voltage magnitudes (e.g., depending on materials utilized for respective conductive contacts of volatile resistive switch 104).

Volatile resistive switch 104 can comprise a top electrode and a bottom electrode. The top electrode and bottom electrode of volatile resistive switch 104 are electrical conductors, and are comprised of materials suitable to facilitate conduction of current. In one or more embodiments, the top electrode and bottom electrode of volatile resistive switch 104 can comprise a material(s) providing or facilitating provision of mobile atoms or ions in response to a suitable stimulus. Examples of suitable stimuli can include an electric field (e.g. a programming voltage), joule heating, a magnetic field, or other suitable stimuli for directed or partially directed particle motion. In an embodiment at least a subset of memory cell 100 can be formed between back-end-of-line (BEoL) metal layers of a semiconductor chip. For instance, volatile resistive switch 104 and conductive contacts between volatile resistive switch 104 and upper capacitor 102 or lower capacitor 106 can be formed as part of BEoL processes. In other examples memory cell 100 can be formed entirely in BEoL processes (e.g., where transistor/lower capacitor 106 and selection transistor 114 are formed in a BEoL dielectric layer above a substrate). In another embodiment, the memory cell 100 and circuit can scale below the 20 nm technology size.

Examples of suitable materials for the top electrode or bottom electrode of volatile resistive switch 104 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth, as described above or elsewhere herein). A noble metal or alloy thereof can be utilized to facilitate mitigated interaction between the top electrode or the bottom electrode and a selector layer of volatile resistive switch 104, situated between the top electrode and the bottom electrode, for instance. This mitigated particle interaction (e.g., mitigating or avoiding chemical bonding of the top electrode particles or the bottom electrode particles with particles of the selector layer of volatile resistive switch 104) can facilitate improved longevity and reliability for volatile resistive switch 104, as one example. Another example of a suitable material for the top electrode or the bottom electrode can include a material with relatively fast diffusing particles. Faster diffusion can include, for instance, a capacity to move among defect sites (e.g., voids or gaps in molecular material) within a solid, e.g., defined by a suitable surface energy, facilitating dispersion of the relatively fast diffusion particles absent a suitable aggregating force, for instance (e.g., an external voltage of greater than a threshold magnitude). Materials with relatively fast diffusing particles can facilitate fast state switching of volatile resistive switch 104 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, the top electrode of volatile resistive switch 104 can be comprised of the same material or substantially the same material as the bottom electrode of volatile resistive switch 104. In other embodiments, the top electrode and bottom electrode can be different materials. In still other embodiments, the top electrode and bottom electrode can be at least in part the same material, and in part different materials. For instance, the top electrode could comprise a suitable conductive material, and the bottom electrode could at least in part comprise an alloy of the suitable conductive material, or the suitable conductive material in combination with another suitable conductor, as an illustrative example.

In addition to the foregoing, volatile resistive switch 104 includes a selector layer disposed between the top electrode and the bottom electrode of volatile resistive switch 104. In contrast to top electrode or bottom electrode, however, the selector layer can be an electrical insulator or ionic conductor. Further, the selector layer can be a material (e.g., an oxide, a sub-oxide, etc.) at least weakly permeable to particles of the top electrode or bottom electrode. In some embodiments, the selector layer can be a non-stoichiometric material. In such embodiments suitable materials for selector layer 104 can include, e.g., non-stoichiometric materials of: $SiO_X$, $TiO_X$, $AlO_X$, $WO_X$, $Ti_XN_YO_Z$, HfOx, TaOx, NbOx, or the like, or suitable combinations thereof, where x, y and z can be suitable non-stoichiometric values. As a particular non-limiting example, the selector layer can be $SiO_x$ where x is between about 0.1 and about 2. In some embodiments, the selector layer can be a (doped or undoped) chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx, and so forth). In at least one embodiment of the present disclosure, the selector layer can be doped with a metal(s) during fabrication, to facilitate metal ion injection from the top or bottom electrode.

In response to a suitable signal applied at non-volatile memory cell 100, volatile resistive switch 104 can transition from a non-conducting state having a high electrical resistance and a first current (or a first range of currents), to a relatively-conducting state having a lower electrical resistance and a second current (or a second range of currents). In various embodiments, a current ratio of the first current(s) to the second current(s) can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. In a further embodiment, the current ratio can be within a range of current ratios from about 10E9 to about 10E11. Other suitable current ratios can be provided for a volatile resistive switch 104 in various other suitable embodiments. It is expected with further research, current ratios of up to 10E15 or 10E18 may be obtainable.

Figure 2:
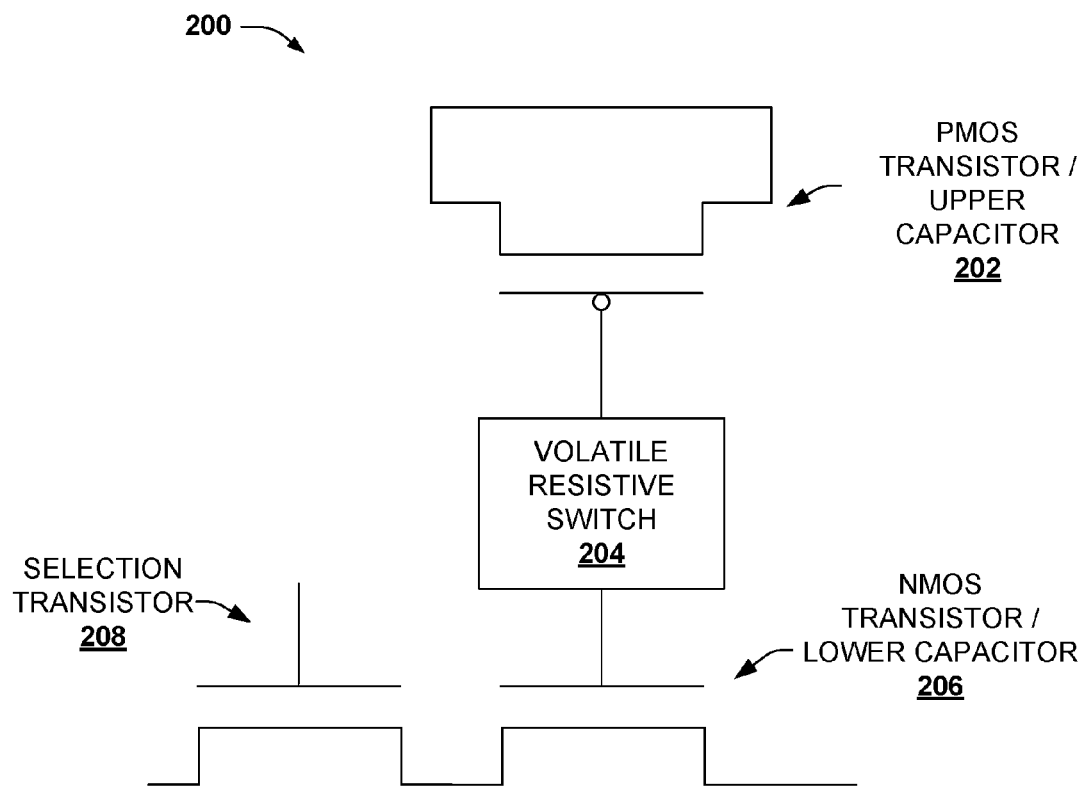
FIG. 2 depicts a schematic diagram of a sample circuit for a non-volatile memory cell according to alternative or additional embodiments of the disclosure.

FIG. 2 illustrates a block diagram of a non-volatile memory cell 200 according to alternative or additional embodiments of the present disclosure. Non-volatile memory cell 200 can comprise a PMOS transistor/upper capacitor 202, having a gate connected to a first end of a volatile resistive switch 204. A second end of volatile resistive switch 204 can be connected to a gate of an NMOS transistor/lower capacitor 206. Volatile resistive switch 204 can transition from a non-conductive state having a high electrical resistance and a first current (or first range of currents), to a relatively conducting state having a lower electrical resistance and a second current (or a second range of currents). In various embodiments, a current ratio of the first current(s) to the second current(s) can be 10E9 or more.

Programming of non-volatile memory cell 200 can be implemented in the following example programming operation, although other example programming operations suitable to the circuit depicted by FIG. 2 are considered within the scope of the subject disclosure. A voltage (or field) applied across PMOS transistor/upper capacitor 202 can induce an accumulation of charge at the first end (e.g., a first terminal, a top electrode, etc.) of volatile resistive switch 204. This results in a charge differential across volatile resistive switch 204, with increasing charge at the first end, and charge at the second end of volatile resistive switch 204 remaining much lower (e.g., relatively constant). When the charge differential across volatile resistive switch 204 results in at least a threshold voltage, volatile resistive switch transitions to the relatively conducting state having the lower electrical resistance. This results in current flowing from the first end of volatile resistive switch 204, to the gate of NMOS transistor/lower capacitor 206. When of sufficient magnitude, this charge at the gate of NMOS transistor/lower capacitor 206 can activate the NMOS transistor, causing current flow from a source of the NMOS transistor to a drain of the NMOS transistor.

As the difference in charge across volatile resistive switch 204 decreases (e.g., as the accumulation of charge at the second end of volatile resistive switch 204 increases or the accumulation of charge at the first end of volatile resistive switch 204 decreases), the voltage across volatile resistive switch 204 likewise decreases. When the voltage decreases below the threshold voltage (or below a second threshold voltage, having a magnitude associated with transitioning volatile resistive switch 204 from the relatively conductive state back to the non-conductive state), volatile resistive switch 204 transitions back to the non-conductive state, trapping charge that had accumulated at the gate of NMOS transistor/lower capacitor 206 in response to volatile resistive switch 204 having previously transitioned to the relatively conducting state. Note that this charge accumulated at the gate of NMOS transistor/lower capacitor 206 can remain for at least a retention period, even in the absence of external power applied to non-volatile memory cell 200. The activation state of the NMOS transistor is therefore non-volatile, meaning the NMOS can be in an activated or deactivated state without application of external power. The retention period can be related to the current ratio of volatile resistive switch 204. Accordingly, for higher current ratios (e.g., 10E9, 10E10, and higher), the retention period can be quite large, measured in years, decades or even more. This is because the rate at which trapped charge is lost from the gate of NMOS transistor/lower capacitor 206 can depend primarily on an electrical resistance of volatile resistive switch 204. And with very high electrical resistance in the non-conductive state, the rate of charge loss can be quite low, and retention time quite long.

To erase non-volatile memory cell 200, charge trapped at the gate of the NMOS transistor must be reduced sufficient to deactivate the NMOS transistor. In response to a negative voltage (or field) applied to PMOS transistor/upper capacitor 202, charge depletes (or negative charge accumulates, though for simplicity of explanation the remaining description will refer to charge depletion) from the first end of volatile resistive switch 204. This charge depletion, compared to charge accumulated at the gate of the PMOS transistor and the second end of volatile resistive switch 204, results in a negative voltage across volatile resistive switch 204. When the negative voltage reaches an associated negative threshold voltage magnitude (or range of magnitudes), volatile resistive switch 204 again transitions to the relatively conductive state, allowing charge trapped at the gate of the NMOS transistor to travel to the first end of volatile resistive switch 204 and deactivate the NMOS transistor. Reduced differential in charge accumulation across volatile resistive switch 204 results in volatile resistive switch 204 transitioning again to the non-conductive state, thereby maintaining the NMOS transistor in the deactivated state. Because volatile resistive switch 204 is a volatile device and does not change state without application of external stimulus (e.g. voltage or field), NMOS transistor remains deactivated even in the absence of an external stimulus. Accordingly, the NMOS transistor, and non-volatile memory cell 200, can operate as a bipolar switching device, and is non-volatile for its activated and deactivated states.

Additionally, non-volatile memory cell 200 can comprise a selection transistor 208. Selection transistor 208 can be utilized to connect or disconnect a drain of NMOS transistor/lower capacitor 206 to a sensing circuit, or other suitable circuitry (e.g., logic gates, etc., depending on utilization of non-volatile memory cell 200). In the former case, selection transistor 208 can be activated to determine whether the NMOS transistor 206 is activated or deactivated, and therefore whether non-volatile memory cell 200 is in a program or erase state, respectively. Arrays of non-volatile memory cell 200 can be constructed and operated in similar fashion as described above, and further can be read utilizing respective selection transistors 208.

In an alternative embodiment(s), upper capacitor 202 can be a NMOS transistor. In still another embodiment(s), upper capacitor 202 can be a metal-insulator-metal (M-I-M) device (e.g., see FIG. 3, infra, including metal material 328, insulator material 326 and a metal electrode such as top metal material 328). The upper capacitor 202 can operate in substantially similar fashion as PMOS transistor/upper capacitor 202, described above. The NMOS transistor can be fabricated in a similar fashion as described for NMOS transistor/lower capacitor 206 (e.g., see FIG. 4, infra).

Figure 3:
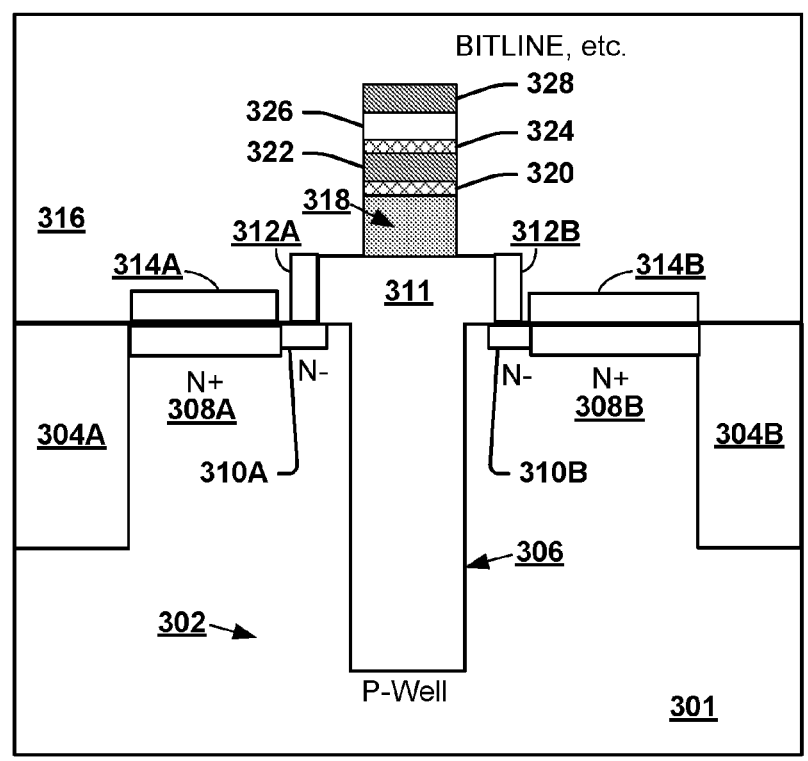
FIG. 3 illustrates a block diagram of a sample high density non-volatile memory cell according to one or more embodiments.

FIG. 3 illustrates a cross section diagram of an example non-volatile memory device 300 according to still further embodiments of the present disclosure. Non-volatile memory device 300 comprises a deep trench transistor device 302 having a p-well 306 formed deeply within a substrate 301 of non-volatile memory device 300. In some embodiments, p-well 306 can be up to (about) 0.2 µm in depth (e.g., below a surface of substrate 301). In other embodiments, p-well 306 can be greater than about 0.1 µm in depth. In at least some embodiments, p-well 306 can be less than about 0.1 µm in width (left to right, when looking at the page of FIG. 3). For instance, p-well 306 can be about 0.55 µm wide or less, in some embodiments.

Isolation oxides 304A, 304B are provided at a perimeter of deep trench transistor device 302. An N+ source 308A and N+ drain 308B are provided, with lightly doped N-contacts 310A, 310B, as depicted. Drain and source regions 308A, 308B and lightly doped n-contacts can be formed by ion implantation with arsenic or phosphorous (for NMOS type transistors) or boron (for PMOS type transistors). In some embodiments, insulating (e.g., dielectric) spacers 312A, 312B can be provided flanking a gate 311 of deep trench transistor device 302. In an embodiment, gate 311 can have a width substantially the same as the width of p-well 306.

Overlying and in electrical contact with gate 311 is a metal interconnect 318. Overlying metal interconnect 318 is a selector layer stack comprising a bottom electrode metal 320, a volatile resistive-switching selector layer 322, and a top electrode metal 324. The selector layer stack can operate as a volatile resistive switching selector device as described herein (e.g., volatile resistive switch 104, volatile resistive switch 204, etc.). Overlying top electrode metal 324 is an insulator material 326 (e.g., an oxide), and a metal material 328 (e.g., a metal line of a memory device, such as a bitline, wordline, dataline, sourceline, etc.) Metal material 328, insulator material 326 and top electrode metal 324 can form a M-I-M capacitor (e.g., for upper capacitor 402 of FIG. 4, supra). In an embodiment, an additional metal material (not depicted) can be provided between top electrode metal 324 and insulator material 326 to serve as a separate bottom contact for the M-I-M capacitor (e.g., replacing top electrode metal 324). Top electrode metal 324 can serve as a metal interconnect between the M-I-M capacitor and the volatile resistive switching selector layer 322, in various embodiments, and metal interconnect 318 serves as a metal interconnect between the volatile resistive switching selector layer 322 and gate 311. The metal interconnect 318, gate 311 (e.g., a polysilicon material, silicide, metal, or the like) and source or drain of deep trench transistor device 302 can serve as an additional capacitor (e.g., the gate of NMOS transistor/lower capacitor 206 of FIG. 2, supra). In an embodiment, deep trench transistor device 302 can be constructed with an n-well as an alternative to p-well 306, and with p-type source and drain 308A, 308B (optionally with p-type lightly doped contacts 310A, 310B), and employed for PMOS transistor/upper capacitor 202 (or PMOS transistor 420), as one example.

Figure 4:
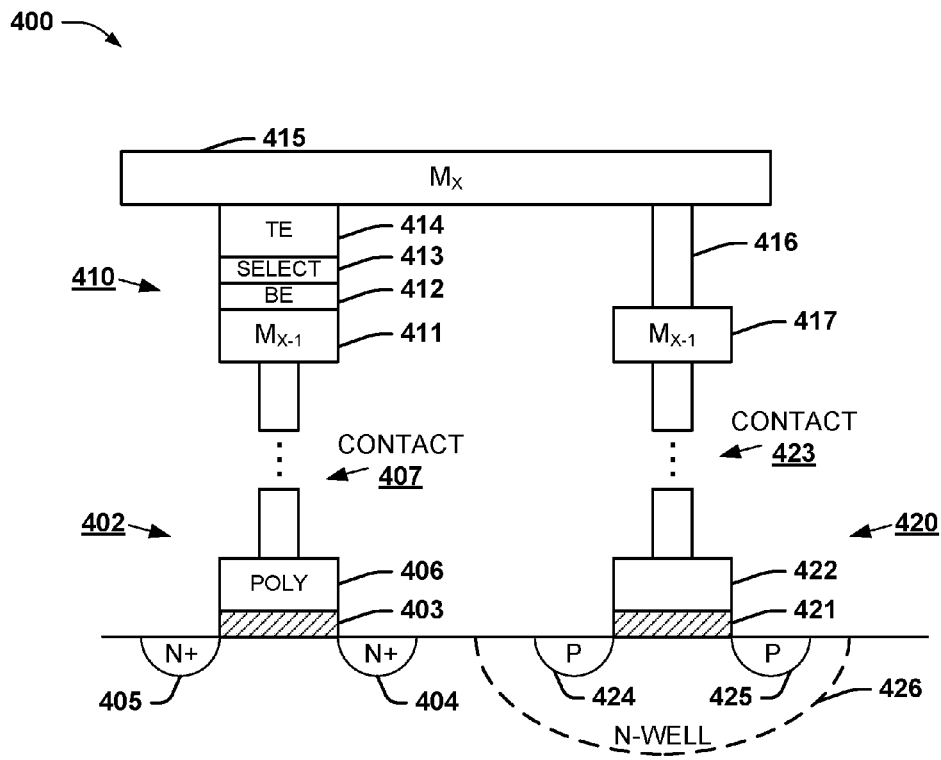
FIG. 4 depicts a block diagram of a sample non-volatile memory cell suitable for fabrication according to IC-Foundry compatible processes.

FIG. 4 illustrates a block diagram of a sample non-volatile memory cell 400 according to alternative or additional embodiments of the present disclosure. In various disclosed embodiments, non-volatile memory cell 400 can be fabricated utilizing existing IC-Foundry compatible processes. Thus, non-volatile memory cell 400 can be fabricated at commercial scales with minimal retooling, facilitating significantly reduced cost of manufacture in various embodiments. Further, at least a subset of non-volatile memory cell 400 can be constructed with BEoL processes, enabling low-cost integration of an array of non-volatile memory cells 400 with FEoL circuitry (e.g., processors, sensors, wiring, inductors, capacitors, logic arrays, switches, latches, and so forth, as well as various other active or passive components) of a single integrated circuit chip. Accordingly, non-volatile memory cell 400 can facilitate high speed operation (e.g., read times on the order of nanoseconds, or lower depending on clock speed), high density array formation (e.g., utilizing deep trench, low-profile gate transistors illustrated in FIG. 3, supra), as well as low-cost integration with FEoL integrated circuitry. This can result in an extraordinarily flexible memory utilized in standalone memory devices (e.g., removable memory), embedded memory devices (e.g., memory embedded with a processor, a radio, a GPS, or other active component(s)), or combinations thereof, achieving high performance as well as low cost fabrication and integration with other electronic components.

As depicted by FIG. 4, non-volatile memory cell 400 can comprise an NMOS transistor 402 and a PMOS transistor 420. In some embodiments, NMOS transistor 402 and PMOS transistor 420 can be formed at least in part within a substrate material (e.g., a p-type material, an n-type material, etc.). In other embodiments, NMOS transistor 402 and PMOS transistor 420 can be formed in a dielectric material overlying a substrate. Similarly to the substrate, the dielectric material can be a p-type material (or n-type material), whether intrinsically or by suitable p-type (or n-type) deposition. In alternative embodiments, PMOS transistor 420 can be an NMOS transistor or M-I-M device.

NMOS transistor 402 can comprise a p-well (not depicted) having n-type contacts 404, 405 formed near a surface of the p-well. An insulating material can form a gate insulator 403 with a gate 406 of NMOS transistor 402 formed over the gate insulator 403. In various embodiments, gate insulator 403 can be constructed to be highly electrically resistive, so as to mitigate or avoid leakage of charge trapped at gate 406 of NMOS transistor 402. In addition, gate insulator 403 can be constructed to minimize leakage paths to n-type contacts 404, 405, or other conductive materials (not shown).

PMOS transistor 420 can comprise an n-well 426. N-well 426 can be formed via deposition of suitable n-type species within the substrate (or dielectric) employed for non-volatile memory cell 400. Additionally, a pair of p-type contacts 424, 425 provides a source and drain of PMOS transistor 420. A gate 422 formed over a gate insulator 421 is also provided. In an embodiment, gate 422 and gate insulator 421 can be formed from the same materials employed for gate 406 and gate insulator 403 of NMOS transistor 402, though in another embodiment different material(s) can be used.

Vertical contacts 407 and 423 are formed over and in electrical contact with gate 406 and gate 422, respectively. Vertical contacts 407 and 423 are broken by respective dotted lines, to indicate vertical contacts 407 and 423 can be formed to varying lengths, suitable to contact BEoL metal layers ($M_{x-1}$) 411 and 417, respectively. Though BEoL metal layers 411 and 417 are depicted as equivalent metal layers (e.g., layer $M_{x-1}$), in other embodiments contact 407 and contact 423 can terminate at different BEoL metal layers (e.g., layer $M_{x-1}$ and $M_{x-2}$, among others).

Overlying BEoL metal layer 411, a volatile resistive-switching selector device 410 is formed. Volatile resistive-switching selector device 410 can comprise a bottom electrode 412, a selector layer 413 and a top electrode 414. In some embodiments, selector layer 413 can have high intrinsic electrical resistance, and furthermore can be permeable to particles of bottom electrode 412 or top electrode 414. Additionally, selector layer 413 can have relatively few particle-trapping defect sites, facilitating sparse penetration of selector layer 413 by particles of bottom electrode 412 or top electrode 414. This sparse penetration can facilitate formation of a relatively thin conductive filament (e.g., a few particles wide, or less) of the particles through selector layer 413. Such a conductive filament can have low structural stability, rapidly deforming in response to a reduction in an external filament-forming stimulus, facilitating rapid volatile operation of volatile resistive-switching selector device 410.

In some embodiments, bottom electrode 412 can be of the same material as top electrode 414. In other embodiments, different materials can be employed for bottom electrode 412 and top electrode 414 (e.g., different metals), or materials that are partly the same and partly different (e.g., different alloys of the same metal, different metal alloys, etc.). In some embodiments, volatile resistive-switching selector device 410 can be formed below BEoL metal layer 411, rather than overlying BEoL metal layer 411.

Overlying BEoL metal layer 417 is an electrical contact 416. In the embodiment illustrated by FIG. 4, electrical contact 416 can have the same height or substantially the same height as volatile resistive-switching selector device 410, although other embodiments in which electrical contact 416 has a different height from volatile resistive-switching selector device 410 are considered within the scope of the subject disclosure (e.g., an embodiment where volatile resistive-switching selector device 410 comprises three thin films having smaller combined thickness than an inter-metal distance between metal layers $M_{x-1}$ and $M_x$, and a conductive plus is formed overlying volatile resistive-switching selector device 410, an embodiment where volatile resistive-switching device 410 is formed between a different set of BEoL metal layers as vertical contact 416, an embodiment where volatile resistive-switching selector device 410 is formed below BEoL metal layer 411, and so forth).

A second BEoL metal layer 415 (e.g., $M_x$) can be formed overlying vertical contact 416 and volatile resistive-switching selector device 410. In various embodiments, second BEoL metal layer 415 can be formed in direct contact with both a top surface of top electrode 414, and a top surface of vertical contact 416. In other embodiments, second BEoL metal layer 415 can be formed in electrical contact with top electrode 414 and vertical contact 416, with one or more intermediary conductive materials formed there between. Second BEoL metal layer 415, vertical contact 416, BEoL metal layer 417 and contact 423 can therefore complete a series electrical connection between top electrode 414 of volatile resistive-switching selector device 410 and gate 422 of PMOS transistor 420. Similarly, BEoL metal layer 411 and contact 407 facilitate a series electrical connection between bottom electrode 412 and gate 406 of NMOS transistor 402. Accordingly, the structure of non-volatile memory cell 400 depicted by FIG. 4 can produce the schematic diagram of non-volatile memory cell 200 of FIG. 2, supra.

In various embodiments, a conductive plug may be disposed between metal layer 411 and bottom electrode 412, and a (second) conductive plug may be disposed between top electrode 414 and metal layer 415. The conductive plug(s) may be used if the combined height of layers 412, 413 and 414 is less than the interlayer spacing between metal layers 415 and 411. In some embodiments, the conductive plugs may be formed from Ti, TiN, Ta, TaN, TiW, W or other suitable materials. The materials may serve as an adhesion layer or a buffer layer between the respective materials or one or more other layers depicted by FIG. 4. For instance if metal layer 411 comprises a copper metal material, a conductive plug that serves as a buffer layer (and optionally an adhesion layer) may include TaN, W, or the like.

In various embodiments, metal layers, such as 411 and 415 may be formed with aluminum material, copper material, aluminum alloy, copper alloy, or the like. Although not specifically shown, it should be understood that one or more barrier/adhesion material layers are typically used along with certain metals. For example, when depositing copper using a single or dual-damascene process, a liner of TaN may be formed prior to depositing the copper, and a barrier of TaN is formed on top of the copper after planarization, or the like. Other suitable embodiments, including constructs or processes, known in the art or made known to one of ordinary skill in the art by way of the context provided herein are considered within the scope of the subject disclosure.

FIGS. 5 through 18 illustrate example processing operations for fabricating a non-volatile memory cell such as non-volatile memory cell 400 (or non-volatile memory cell 200), in various embodiments. In other embodiments, alternative or additional processing operations can be employed to fabricate such a memory cell, and in some embodiments fewer processing operations can be employed to produce such a memory cell. In further embodiments, the depicted processing operations, suitable variations thereof, or suitable additional operations or fewer operations, can be employed to produce alternative embodiments of such non-volatile memory cell 400 known in the art or made known to one of ordinary skill in the art by way of the context provided herein. Such processing operations, variations thereof, and non-volatile memory cells are considered within the scope of the present disclosure.

Figure 5:
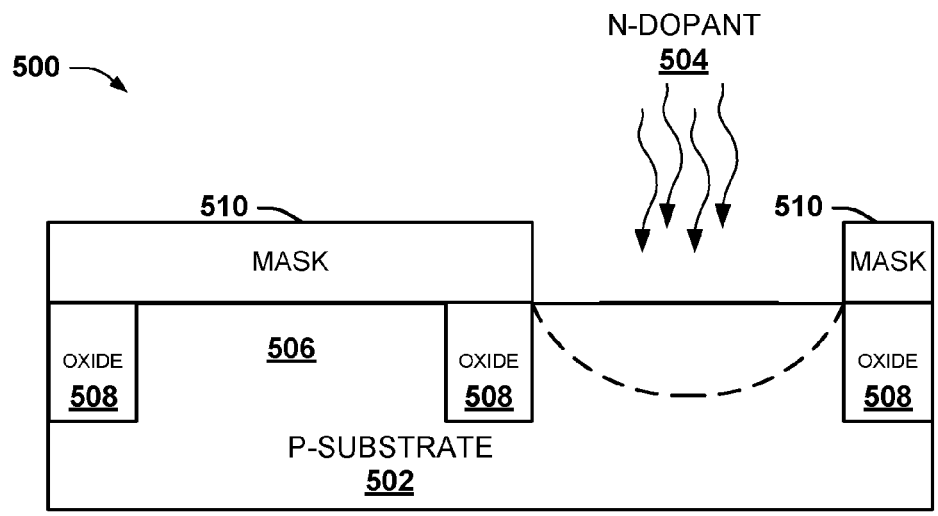
FIGS. 5 and 6 illustrate block diagrams of example front-end-of-line (FEoL) doping and patterning operations for a non-volatile memory cell.

FIG. 5 illustrates a block diagram of an example IC device 500 related to fabricating a non-volatile memory cell, according to embodiments of the present disclosure. IC device 500 can comprise a p-type substrate 502 having insulation oxides 508 formed therein. A mask 510 overlying p-type substrate 502 facilitates selective doping of an n-type dopant 504 to a subset of p-type substrate 502 (the subset being indicated approximately by the dashed line). A region of p substrate 502 beneath mask 510 (on a left hand side of IC device 500) can serve as a p-well 506 for a transistor device.

Figure 6:
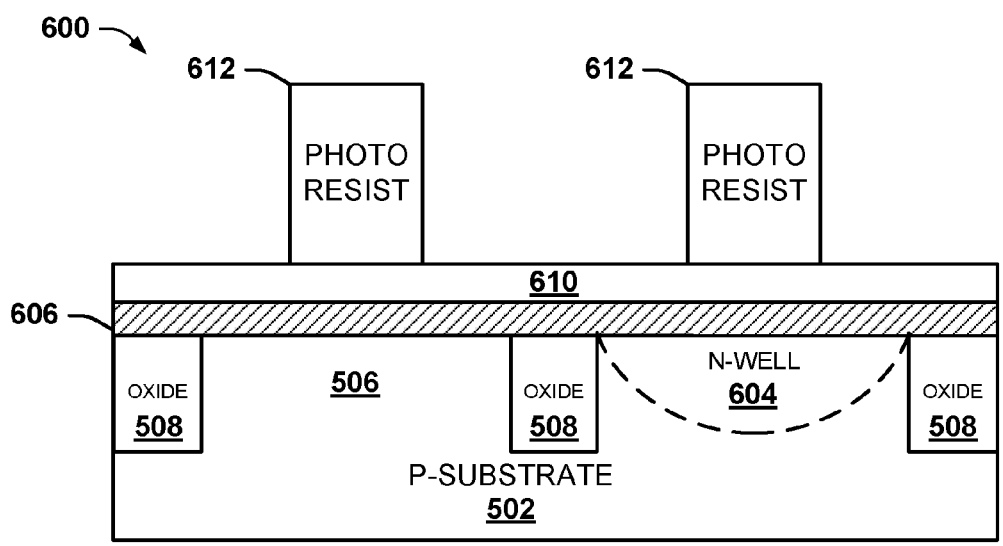

FIG. 6 illustrates a block diagram of an example IC device 600 related fabrication of a non-volatile memory cell, in further embodiments. IC device 600 includes formation of an n-well 604 in response to the n-type dopant 504. Following the selective doping of the n-type dopant 504 and creation of n-well 604, mask 510 can be removed (e.g., via planarization, selective etching, etc.). An insulating material layer 606 (e.g., oxide, etc.) is provided overlying p-well 506, p-substrate 502, n-well 604 and insulation oxides 508, and a suitable gate material layer 610 is provided over insulating material layer 606. Additionally, a photo resist 612 can be deposited, and patterned and etched overlying insulating material layer 606 and gate material layer 610, above p-well 506 and n-well 604.

Figure 7:
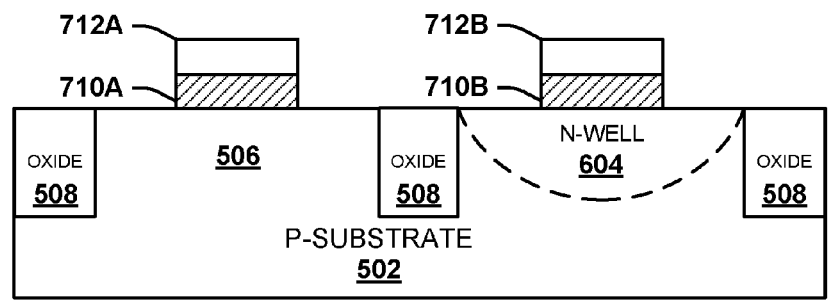
FIGS. 7 and 8 depict block diagrams of example gate and channel fabrication operations for a non-volatile memory cell in further embodiments.
Figure 8:
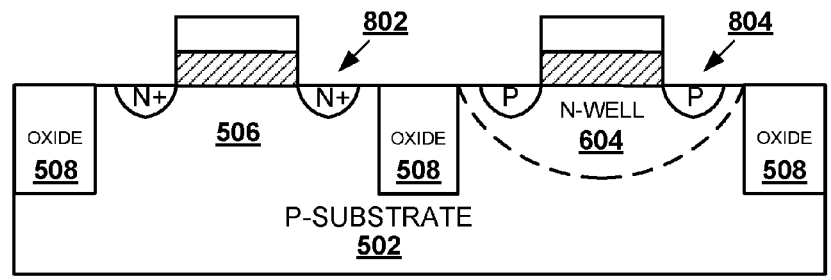

FIG. 7 illustrates a block diagram of an example IC device 700 related to fabrication of a non-volatile memory cell. IC device 700 comprises selectively etched gate and gate insulators over n-well 604 and p-well 506. The selectively etched gate and gate insulators form a gate 712A and gate insulator 710A over p-well 506, and a second selectively etched gate 712B and gate insulator 710B over n-well 604, as depicted. FIG. 8 illustrates an IC device 800 comprising an NMOS and PMOS transistor. Suitable n-type dopants can be doped to p-well 506 adjacent the gate insulator 710A and gate 712A, to form a source and drain of an NMOS transistor 802. Likewise, suitable p-type dopants can be doped to n-well 604 adjacent the gate insulator 710B and gate 712B to form a source and drain of a PMOS transistor 804.

Figure 9:
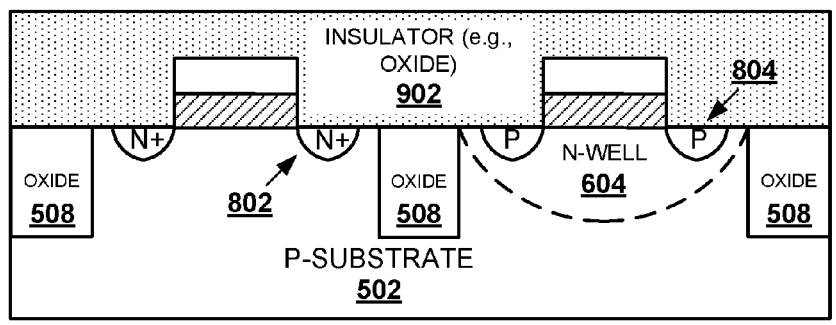
FIGS. 9 and 10 illustrate block diagrams of sample oxidation and planarization operations for a non-volatile memory cell, in an embodiment(s)
Figure 10:
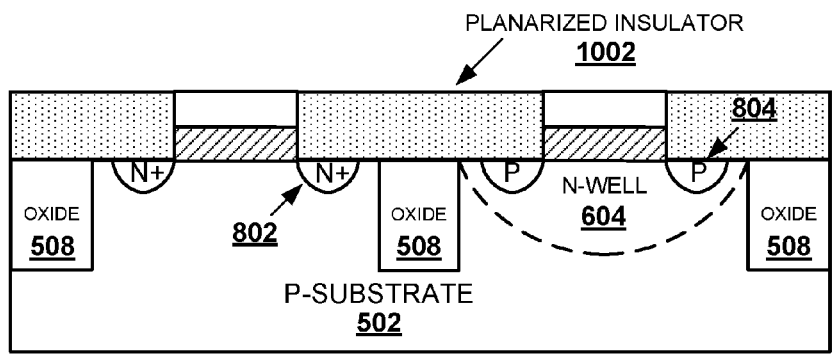

FIG. 9 depicts a block diagram of an example IC device 900 related to fabrication of a non-volatile memory cell in further embodiments. IC device 900 can comprise an insulator layer 902 formed over NMOS transistor 802 and PMOS transistor 804, as well as oxides 508. Insulator layer 902 can be an oxide, or other suitable strong electrical insulator. At FIG. 10, an example IC device 1000 is depicted having insulator layer 902 planarized to form a planarized insulator 1002. Planarized insulator 1002 can be substantially coplanar with a top surface of gate 712A or gate 712B, in various embodiments.

Figure 11:
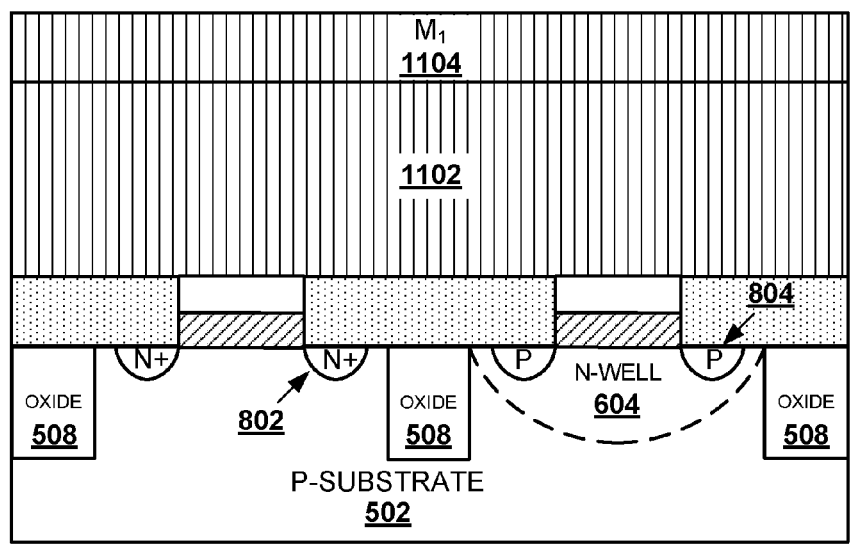
FIGS. 11 and 12 depict block diagrams of example patterning and etching operations of conductive contacts for a non-volatile memory cell.

FIG. 11 illustrates a block diagram of a sample IC device 1100 having one or more conductor layers overlying planarized insulator 1002 and NMOS transistor 802 and PMOS transistor 804. In an embodiment, the one or more conductor layers can include an interconnect layer 1102, and a first BEoL metal layer 1104 (or $M_1$ 1104). In other embodiments, first BEoL metal layer 1104 can be any suitable numbered metal layer, and need not be the first BEoL metal layer formed over planarized insulator 1002. Although interconnect layer 1102 is depicted as a deposited layer, in other embodiments interconnect layer 1102 can be formed within a via defined by an oxide layer material. For instance, interconnect layer 1102 can instead be an oxide layer material, in which two or more vias are formed and conductive material (e.g., metal, etc.) is filled into the vias, and the conductive material and oxide layer material are planarized before deposition of first BEoL metal layer 1104 above the planarized oxide layer material, vias and conductive material.

Figure 12:
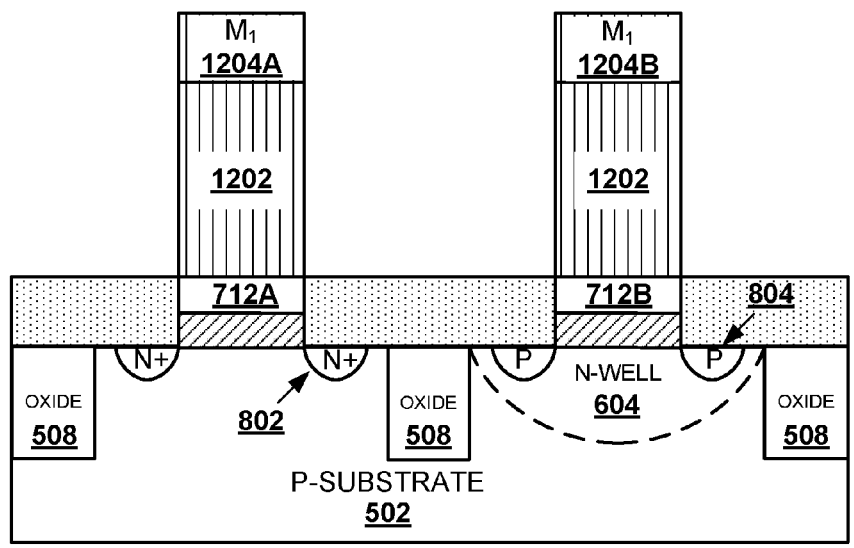

FIG. 12 depicts a block diagram of an example IC device 1100 having discrete BEoL metal lines and conductive interconnects etched from interconnect layer 1102 and first BEoL metal layer 1104. In an embodiment, discrete BEoL metal lines 1204A and 1204B can be continuous lines running into (and out from) the page. In other embodiments, discrete BEoL metal lines can be floating (e.g., isolated) metal regions surrounded by other material. A first line 1204A of BEoL metal layer $M_1$ is connected electrically in series to gate 712A by vertical interconnect 1202. Likewise, a second line 1204B of BEoL metal layer $M_1$ is also connected electrically in series to gate 712B by an associated vertical interconnect 1202. In an alternative embodiment, discrete vertical interconnects 1202 can be formed within a set of vias defined by an insulator layer, as described above. In such embodiments, discrete BEoL metal lines 1204A and 1204B can be selectively etched above the insulator layer, vias and interconnects 1202.

Figure 13:
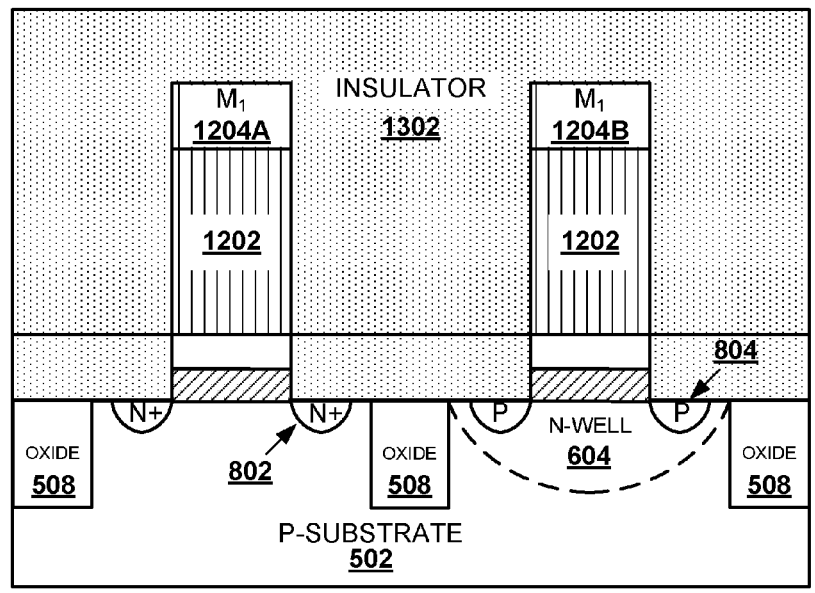
FIGS. 13 and 14 illustrate block diagrams of sample oxidation and planarization operations for a non-volatile memory cell, in further embodiments.
Figure 14:
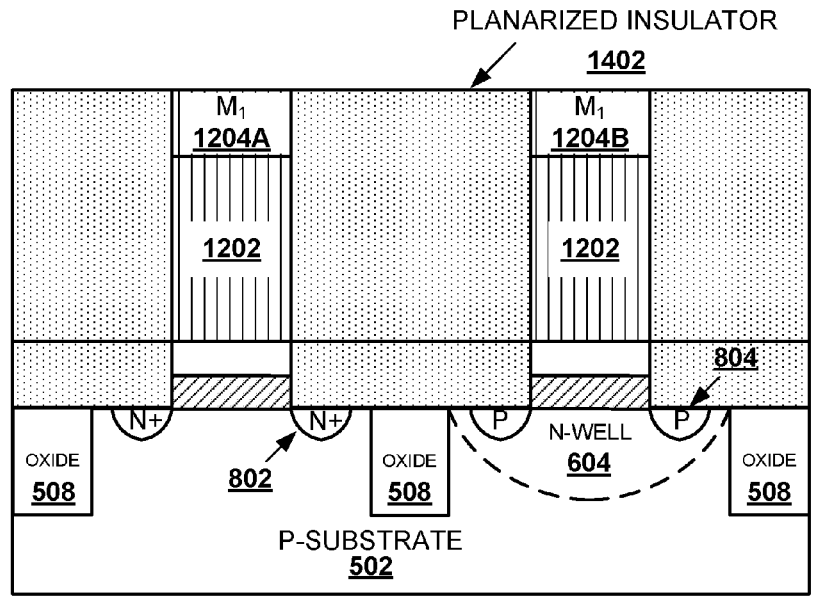

As depicted by FIG. 13, an IC device 1300 is illustrated having an insulator material 1302 formed overlying discrete conductive structures. The discrete conductive structures include vertical interconnects 1202 and first line 1204A of BEoL metal layer $M_1$ and second line 1204B of BEoL metal layer $M_1$. At FIG. 14, an IC device 1400 is illustrated in which insulator material 1302 is planarized to form a planarized insulator 1402. Planarized insulator 1402 can expose respective top surfaces of first line 1204A and second 1204B of the metal layer $M_1$.

In other embodiments, a single or dual damascene process may be used to form interconnects 1202 and metals 1024A and B. For example, a first insulator on top of a second insulator layer may be disposed above the planarized insulator 1102, in FIG. 10; one or more vias may be formed within the first insulator; and then one or more vias may be formed within the second insulator. Subsequently, a barrier metal (e.g. TaN, etc.) and a conductive metal (e.g. Cu) may be deposited within the dual vias in contact to the gate electrodes. The metals are then planarized and a barrier metal is optionally formed over the conductive metal to form the structure in FIG. 14. After this, the processes described below may continue.

Figure 15:
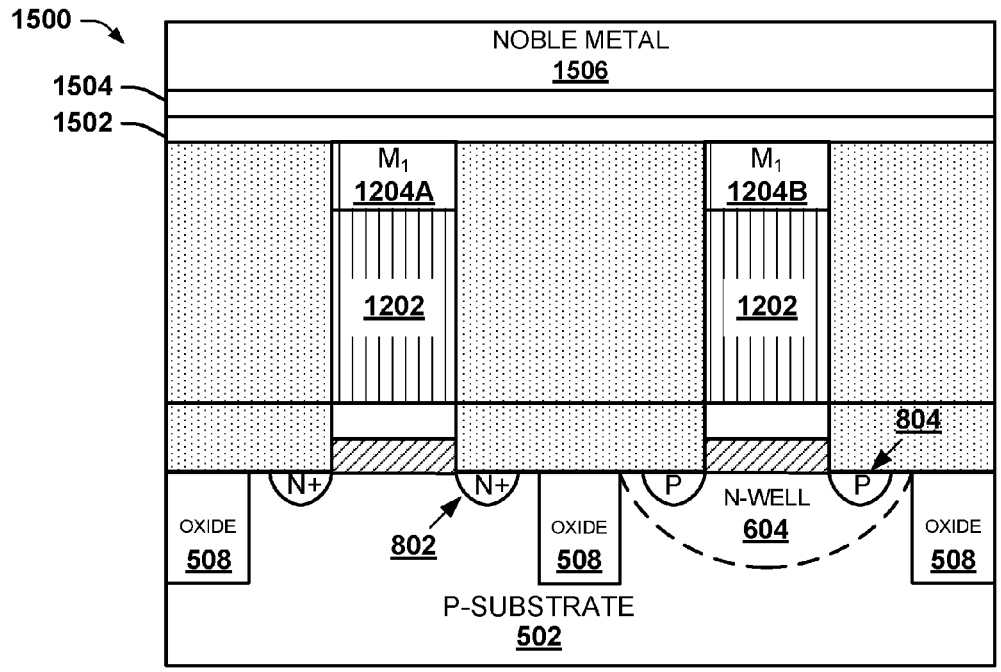
FIGS. 15 and 16 depict block diagrams of example deposition and etching operations for a volatile selection device for a non-volatile cell.
Figure 16:
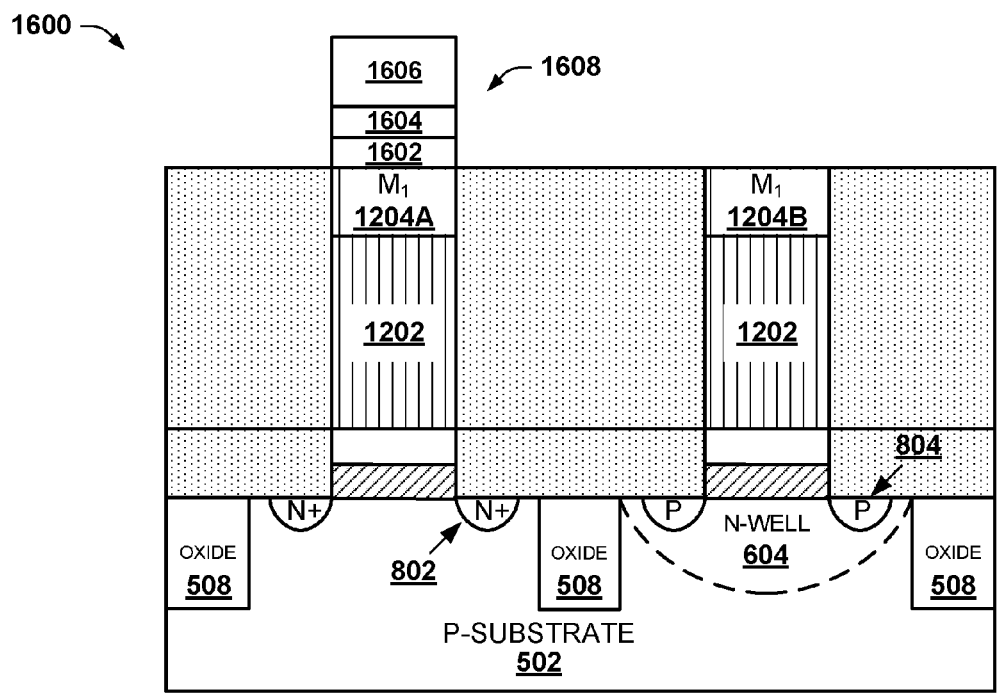

FIG. 15 illustrates an IC device 1500 having a stack of layers overlying planarized insulator 1402 of IC device 1400. The stack of layers can form a volatile selector device, in various embodiments. Particularly, the stack of layers can include a bottom electrode layer 1502 (e.g., a metal bearing layer such as TiN, TaN, Cu, Al, Ag, or alloy thereof, a doped semiconductor layer, etc.), a volatile switching layer 1504 configured to have relatively few particle-trapping defect sites (e.g., a-Si, a silicon sub-oxide ($SiO_x$ where x is within a range from about 0.1 to about 2.0, etc.), and so on), and a top electrode layer (e.g., a metal bearing layer such as TiN, TaN, Cu, Al, Ag, or alloy thereof, a doped semiconductor layer, etc.). At FIG. 16, an IC device 1600 is depicted in which the stack of layers is selectively etched to form a discrete two-terminal, volatile selector device 1608. Selector device 1608 comprises a bottom electrode 1602 in electrical contact with first line 1204A of the $M_1$ BEoL metal layer. A volatile switching medium 1604 overlies the bottom electrode 1602, and a top electrode 1606 overlies the volatile switching medium 1604.

Selector device 1608 can be operable as described herein. For instance, selector device 1608 can switch from a high resistance state to a low resistance state in response to a suitable stimulus applied at the top electrode 1606 or bottom electrode 1602. Further, selector device can revert to the high resistance state in response to a reduction in magnitude (though non-zero) of the external stimulus, and remain in the high resistance state in the absence of the external stimulus.

Figure 17:
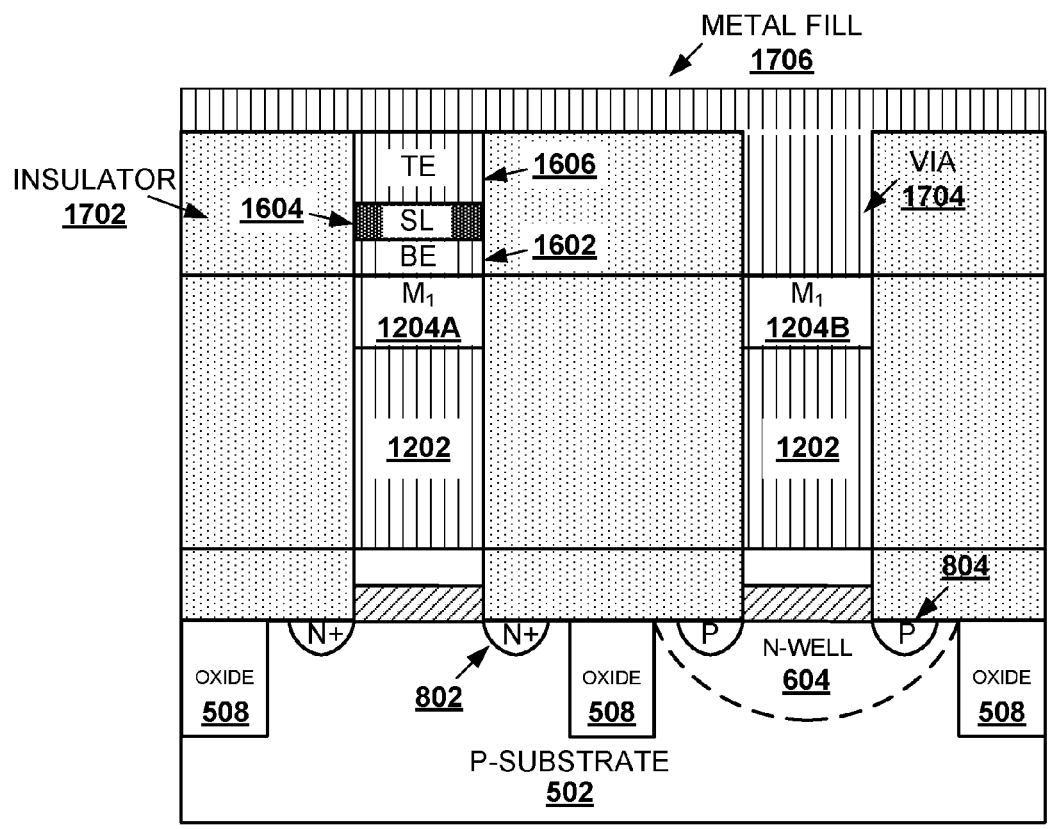
FIG. 17 illustrates a block diagram of a sample etching and metal fill operation for a non-volatile memory cell in one or more other embodiments.

FIG. 17 illustrates a block diagram of an example IC device 1700 according to further disclosed embodiments. IC device 1700 can comprise an insulator layer 1702 formed about and overlying selector device 1608 of FIG. 6, supra. Insulator layer 1702 can be planarized to expose a top surface of top electrode 1606. Further, a via 1704 can be formed within the planarized insulator layer 1702, exposing a top surface of second line 1204B of the $M_1$ BEoL metal layer to via 1704. A metal fill 1706 (e.g. a conductive plug (e.g. TaN, TiN, etc.) can then be provided within via 1704 and in electrical contact with the exposed top surface of second line 1204B of the $M_1$ BEoL metal layer.

In some embodiments, although not depicted, IC device 1700 can then be planarized to remove metal fill 1706 material overlying insulator layer 1702, re-exposing the top surface of top electrode 1606 to an exterior of IC device 1700. In other embodiments, metal fill 1706 overlying insulator layer 1702 is not planarized, but rather is patterned and selectively etched to form a set of conductive lines to serve as an additional set of BEoL metal lines (e.g., metal layer $M_2$ lines). In the former embodiments, after planarizing IC device 1700 to remove metal fill 1706 overlying insulator layer 1702, additional metal can be deposited (e.g., a different metal from metal fill 1706) and then patterned and etched to form the additional set of BEoL metal lines.

Figure 18:
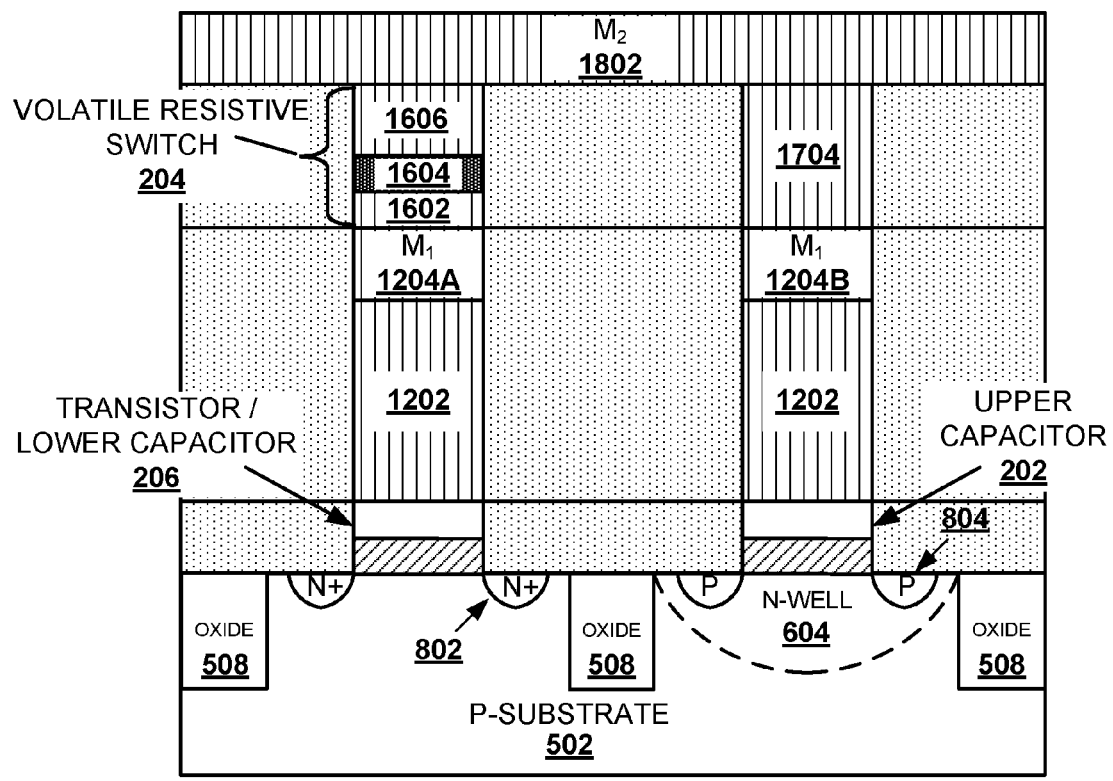
FIG. 18 depicts a block diagram of an example IC-Foundry compatible non-volatile cell comprising a volatile selection device, in an embodiment(s)

FIG. 18 depicts a block diagram of a sample IC device 1800 according to further disclosed embodiments. IC device 1800 comprises a set of $M_2$ BEoL metal lines 1802 (e.g. barrier material along with conducive material), in addition to $M_1$ BEoL metal lines 1204A, 1204B. In some embodiments, $M_2$ metal lines 1802 can extend in length perpendicular or substantially perpendicular to respective lengths of $M_1$ metal lines 1204A, 1204B. In other embodiments, $M_2$ metal lines 1802 can cross $M_1$ metal lines 1204A, 1204B (when viewing IC device 1800 from above the page, looking down) at a non-perpendicular angle.

One of $M_2$ BEoL metal lines 1802 (as depicted in FIG. 18) is electrically connected to both a top electrode 1606 of volatile resistive switch 204, and to a top surface of metal fill 1704. The $M_2$ BEoL metal line 1802 and metal fill 1704 therefore complete a series electrical connection between top electrode 1606 and a top surface of the second line 1204B of $M_1$ BEoL metal layer. A bottom surface of the second line 1204B of $M_1$ BEoL metal layer is connected electrically in series to a gate of upper capacitor 202 (PMOS transistor 804, or an NMOS transistor, or M-I-M capacitor in alternative embodiments) by an associated one of interconnects 1202. Likewise, bottom electrode 1602 of volatile resistive switch 204 is connected electrically in series to a gate of transistor/lower capacitor 206 (NMOS transistor 802) by another associated one of interconnects 1202. Accordingly, in various embodiments, IC device 1800 can complete the circuit illustrated in FIG. 2, supra, in which a volatile resistive switch 204 is connected electrically in series at its top electrode 1606 to a gate of a PMOS transistor 804, and is connected electrically in series at its bottom electrode 1602 to a gate of an NMOS transistor 802. In some embodiments, PMOS transistor 804 and NMOS transistor 802 can be formed in conjunction with FEoL fabrication, and volatile resistive switch 204 (as well as $M_1$ metal lines 1204A, 1204B and $M_2$ metal lines 1802) can be formed in conjunction with BEoL fabrication. In other embodiments, PMOS transistor 804 and NMOS transistor 802 can also be formed in conjunction with BEoL fabrication (e.g., where p-substrate 502 is formed on the backend overlying a lower IC substrate). Thus, IC device 1800 is a flexible device that can be fabricated consistent with existing IC Foundry processes, reducing manufacturing time, expense and enhancing yield, over other two-terminal memory fabrication techniques.

In various embodiments, it should be understood that the volatile resistive switch 204 may be disposed between virtually any two metal layers, not just metal 1 and metal 2, shown below. For example, the volatile resistive switch may be formed between metal 5 and metal 6. In such embodiments, conventional interconnects may be used to electrically couple the volatile resistive switch (e.g. between metal 4 and metal 5) down to the gate electrode, such as disclosed above.

The aforementioned diagrams have been described with respect to interaction between several components of a memory cell, including material layers, stacks of materials, thin films and processing techniques. It should be appreciated that in some suitable alternative aspects of the subject disclosure, such diagrams can include those components and material layers/stacks/thin films specified therein, some of the specified material layers/stacks/thin films, or additional material layers/stacks/thin films. Sub-components can also be implemented as electrically connected to other sub-components rather than included within a parent architecture. Additionally, it is noted that one or more disclosed processes can be combined into a single process providing aggregate functionality. For instance, a selective deposition process could include deposition, patterning and etching, in some embodiments, or deposition, via formation, via fill and planarization, or the like, or vice versa, to facilitate selective formation of discrete structures, or arrays of discrete structures. Components of the disclosed architectures can also interact with one or more other components not specifically described herein but known by those of skill in the art (e.g., electrically, magnetically, thermally, and so forth).

Figure 19:
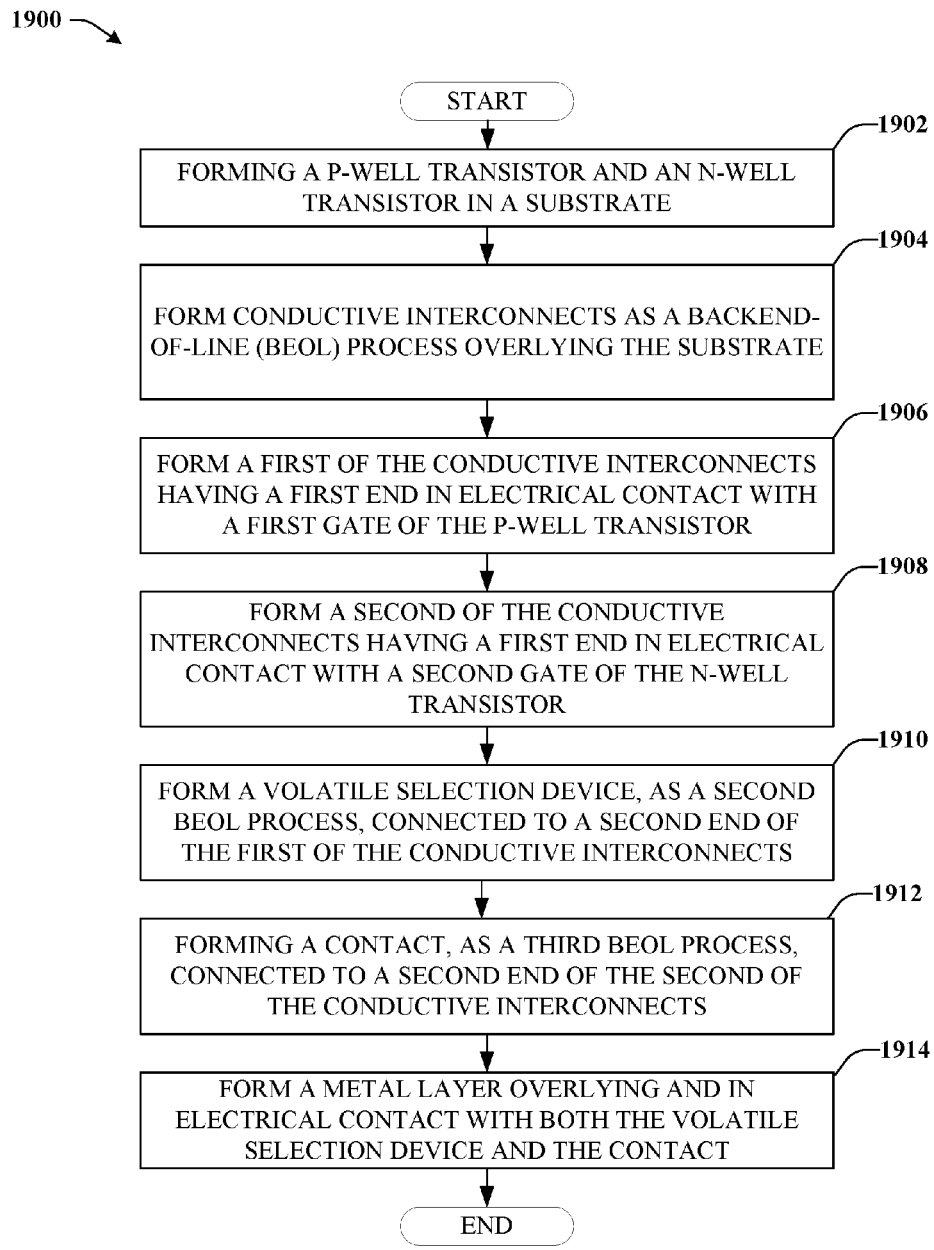
FIG. 19 illustrates a flowchart of a sample method for fabricating a non-volatile memory cell utilizing IC-Foundry compatible operations, in an embodiment(s)

In view of the exemplary diagrams described supra, process methods that can be implemented in accordance with the disclosed subject matter will be better appreciated with reference to the flow chart of FIG. 19. While for purposes of simplicity of explanation, the method of FIG. 19 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods and fabrication or operational processes disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 19 illustrates a flowchart of a sample method 1900 for fabricating a non-volatile memory cell according to IC Foundry compatible techniques, in one or more embodiments. At 1902, method 1900 can comprise forming a first transistor and a second transistor in a substrate. At 1904, method 1900 can comprise forming conductive interconnects as a BEoL process overlying the substrate. Forming the conductive interconnects can further comprise, at 1906, forming a first of the conductive interconnects having a first end thereof in electrical contact with a gate (e.g., a first gate) of the first transistor. Additionally, at 1908, method 1900 can comprise forming a second of the conductive interconnects having a first end thereof in electrical contact with a gate (e.g., a second gate) of the second transistor. At 1910, method 1900 can comprise forming a volatile, resistive-switching selection device connected to a second end of the first of the conductive interconnects. At 1912, method 1900 can comprise forming a contact connected to a second end of the second of the conductive interconnects. Additionally, at 1914, method 1900 can comprise forming a metal layer overlying and in electrical contact with both the volatile selection device and the contact. The metal layer can facilitate a series electrical connection between a top electrode of the volatile, resistive-switching selection device and the contact.

In additional embodiments, method 1900 can comprise forming the volatile, resistive-switching selection device between a first metal line of a first BEoL metal layer, and a second BEoL metal layer. Further, method 1900 can comprise forming the contact between the second metal line of the first BEoL metal layer, and the second BEoL metal layer. In an embodiment, the second BEoL metal layer can be the metal layer overlying and in electrical contact with both the volatile selection device and the contact.

According to still other embodiments, method 1900 can comprise forming the first transistor as a p-well transistor, and forming the second transistor as an n-well transistor. Forming the volatile, resistive-switching selection device can further comprise forming a bottom electrode from a first metal material, forming a selection layer from an insulating medium, and forming a top electrode from a second metal material. In an embodiment, the first metal material or the second metal material can be a noble metal, a noble metal alloy, or can be a material that contains in part a noble metal, although other metals can be employed. In an embodiment, the first metal material or the second metal material can be selected from: a noble metal, a noble metal alloy, a material containing a noble metal, Al, an Al alloy, a material containing Al, Cu, a Cu alloy, or a material containing Cu.

In a further embodiment, method 1900 can comprise planarizing the top electrode of the volatile, resistive-switching selector device and the contact. This can result a top electrode surface and a top contact surface that share or substantially share a common plane. Further, method 1900 can comprise forming the metal layer to be in electrical and physical contact with the top electrode surface and the top contact surface.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 20 and 21, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 20:
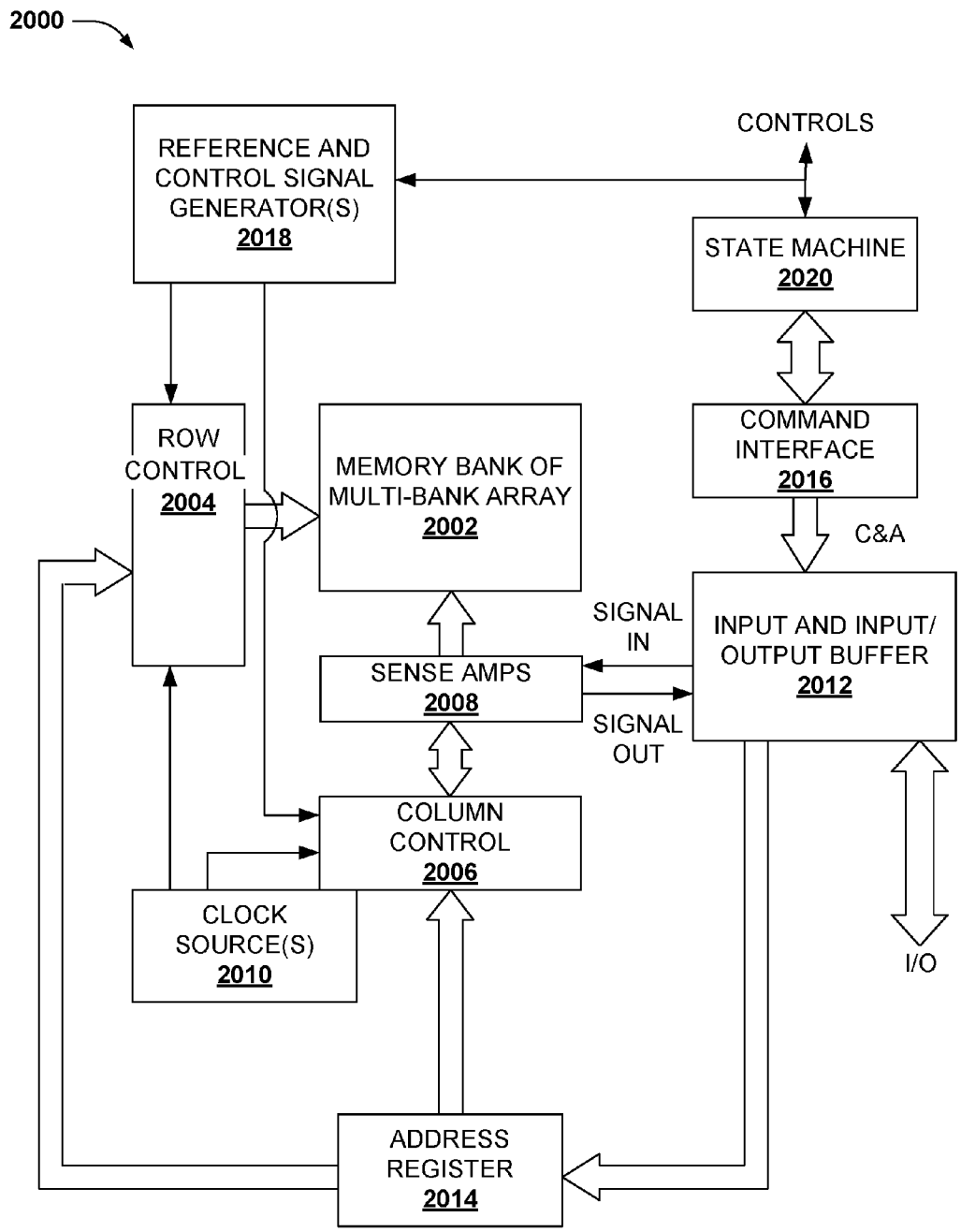
FIG. 20 depicts a block diagram of a sample operating environment for facilitating implementation of one or more aspects disclosed herein.

In order to provide a context for the various aspects of the disclosed subject matter, FIG. 20, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 20 illustrates a block diagram of an example operating and control environment 2000 for a memory cell array 2002 according to aspects of the subject disclosure. In at least one aspect of the subject disclosure, memory cell array 2002 can comprise a variety of memory cell technology. Particularly, memory cell array 2002 can comprise two-terminal memory such as high density, selector-based resistive memory cells with a low-profile gate (e.g., a gate consuming a relatively small substrate surface area compared with conventional transistor gate devices), as described herein.

A column controller 2006 can be formed adjacent to memory cell array 2002. Moreover, column controller 2006 can be electrically coupled with bit lines of memory cell array 2002. Column controller 2006 can control respective bitlines, applying suitable program, erase or read voltages to selected bitlines.

In addition, operating and control environment 2000 can comprise a row controller 2004. Row controller 2004 can be formed adjacent to column controller 2006, and electrically connected with word lines of memory cell array 2002. Row controller 2004 can select particular rows of memory cells with a suitable selection voltage. Moreover, row controller 2004 can facilitate program, erase or read operations by applying suitable voltages at selected word lines.

A clock source(s) 2008 can provide respective clock pulses to facilitate timing for read, write, and program operations of row control 2004 and column control 2006. Clock source(s) 2008 can further facilitate selection of word lines or bit lines in response to external or internal commands received by operating and control environment 2000. An input/output buffer 2012 can be connected to an external host apparatus, such as a computer or other processing device (not depicted) by way of an I/O buffer or other I/O communication interface. Input/output buffer 2012 can be configured to receive write data, receive an erase instruction, output readout data, and receive address data and command data, as well as address data for respective instructions. Address data can be transferred to row controller 2004 and column controller 2006 by an address register 2014. In addition, input data is transmitted to memory cell array 2002 via signal input lines, and output data is received from memory cell array 2002 via signal output lines. Input data can be received from the host apparatus, and output data can be delivered to the host apparatus via the I/O buffer.

Commands received from the host apparatus can be provided to a command interface 2016. Command interface 2016 can be configured to receive external control signals from the host apparatus, and determine whether data input to the input/output buffer 2012 is write data, a command, or an address. Input commands can be transferred to a state machine 2020.

State machine 2020 can be configured to manage programming and reprogramming of memory cell array 2002. State machine 2020 receives commands from the host apparatus via input/output interface 2012 and command interface 2016, and manages read, write, erase, data input, data output, and like functionality associated with memory cell array 2002. In some aspects, state machine 2020 can send and receive acknowledgments and negative acknowledgments regarding successful receipt or execution of various commands.

In an embodiment, state machine 2020 can control an analog voltage waveform generator 2018 that provides read/write and program/erase signals to row control 2004 and column control 2006.

To implement read, write, erase, input, output, etc., functionality, state machine 2020 can control clock source(s) 2010. Control of clock source(s) 2010 can cause output pulses configured to facilitate row controller 2004 and column controller 2006 implementing the particular functionality. Output pulses can be transferred to selected bit lines by column controller 2006, for instance, or word lines by row controller 2004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 21, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 21:
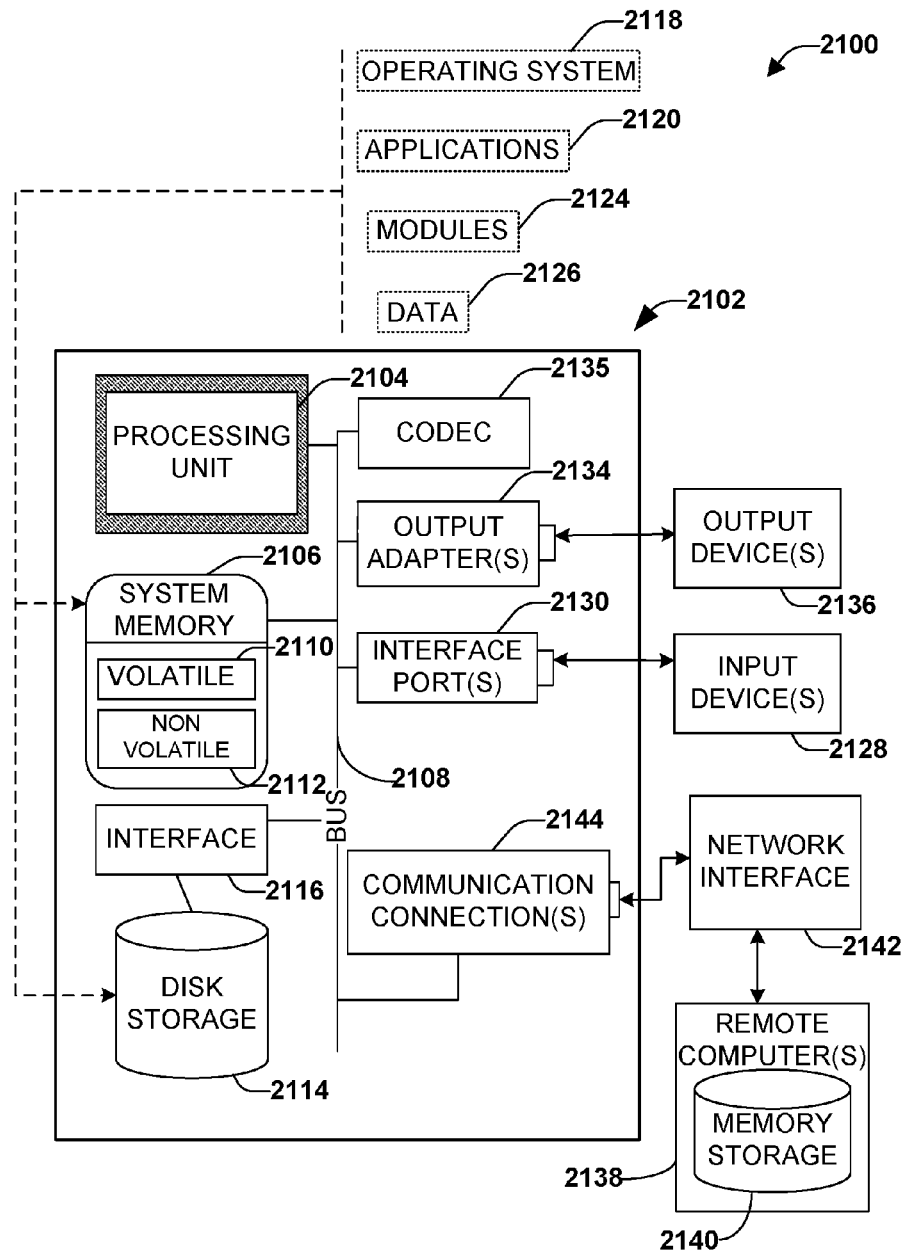
FIG. 21 illustrates a block diagram of an example computing environment that can be implemented in conjunction with various embodiments.

With reference to FIG. 21, a suitable environment 2100 for implementing various aspects of the claimed subject matter includes a computer 2102. The computer 2102 includes a processing unit 2104, a system memory 2106, a codec 2135, and a system bus 2108. The system bus 2108 couples system components including, but not limited to, the system memory 2106 to the processing unit 2104. The processing unit 2104 can be any of various available processors. Dual microprocessors and other multiprocessor architectures also can be employed as the processing unit 2104.

The system bus 2108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2106 includes volatile memory 2110 and non-volatile memory 2112, which can employ one or more of the disclosed memory architectures, in various embodiments. The basic input/output system (BIOS), containing the basic routines to transfer information between elements within the computer 2102, such as during start-up, is stored in non-volatile memory 2112. In addition, according to present innovations, codec 2135 may include at least one of an encoder or decoder, wherein the at least one of an encoder or decoder may consist of hardware, software, or a combination of hardware and software. Although, codec 2135 is depicted as a separate component, codec 2135 may be contained within non-volatile memory 2112. By way of illustration, and not limitation, non-volatile memory 2112 can include read only memory (ROM), programmable ROM (PROM), electrically programmable ROM (EPROM), electrically erasable programmable ROM (EEPROM), or Flash memory. Non-volatile memory 2112 can employ one or more of the disclosed memory devices, in at least some embodiments. Moreover, non-volatile memory 2112 can be computer memory (e.g., physically integrated with computer 2102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 2110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 2102 may also include removable/non-removable, volatile/non-volatile computer storage medium. FIG. 21 illustrates, for example, disk storage 2114. Disk storage 2114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2114 to the system bus 2108, a removable or non-removable interface is typically used, such as interface 2116. It is appreciated that storage devices 2114 can store information related to a user. Such information might be stored at or provided to a server or to an application running on a user device. In one embodiment, the user can be notified (e.g., by way of output device(s) 2136) of the types of information that are stored to disk storage 2114 or transmitted to the server or application. The user can be provided the opportunity to opt-in or opt-out of having such information collected or shared with the server or application (e.g., by way of input from input device(s) 2128).

It is to be appreciated that FIG. 21 describes software that acts as an intermediary between users and the basic computer resources described in the suitable operating environment 2100. Such software includes an operating system 2118. Operating system 2118, which can be stored on disk storage 2114, acts to control and allocate resources of the computer system 2102. Applications 2120 take advantage of the management of resources by operating system 2118 through program modules 2124, and program data 2126, such as the boot/shutdown transaction table and the like, stored either in system memory 2106 or on disk storage 2114. It is to be appreciated that the claimed subject matter can be implemented with various operating systems or combinations of operating systems.

A user enters commands or information into the computer 2102 through input device(s) 2128. Input devices 2128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2104 through the system bus 2108 via interface port(s) 2130. Interface port(s) 2130 include, for example, a serial port, a parallel port, a game port, and a universal serial bus (USB). Output device(s) 2136 use some of the same type of ports as input device(s) 2128. Thus, for example, a USB port may be used to provide input to computer 2102 and to output information from computer 2102 to an output device 2136. Output adapter 2134 is provided to illustrate that there are some output devices 2136 like monitors, speakers, and printers, among other output devices 2136, which require special adapters. The output adapters 2134 include, by way of illustration and not limitation, video and sound cards that provide a means of connection between the output device 2136 and the system bus 2108. It should be noted that other devices or systems of devices provide both input and output capabilities such as remote computer(s) 2138.

Computer 2102 can operate in a networked environment using logical connections to one or more remote computers, such as remote computer(s) 2138. The remote computer(s) 2138 can be a personal computer, a server, a router, a network PC, a workstation, a microprocessor based appliance, a peer device, a smart phone, a tablet, or other network node, and typically includes many of the elements described relative to computer 2102. For purposes of brevity, only a memory storage device 2140 is illustrated with remote computer(s) 2138. Remote computer(s) 2138 is logically connected to computer 2102 through a network interface 2142 and then connected via communication connection(s) 2144. Network interface 2142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2144 refers to the hardware/software employed to connect the network interface 2142 to the bus 2108. While communication connection 2144 is shown for illustrative clarity inside computer 2102, it can also be external to computer 2102. The hardware/software necessary for connection to the network interface 2142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

In various embodiments, the voltages applied to the memory device were illustrated to be linear. In other embodiments, the voltages may be non-linear, step-type functions, or the like.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of fabricating a non-volatile memory device, comprising:
   forming a first transistor and a second transistor in a substrate;
   forming conductive interconnects as a backend-of-line (BEoL) process overlying the substrate, which further comprises:
   forming a first of the conductive interconnects having a first end thereof in electrical contact with a first gate of the first transistor;
   forming a second of the conductive interconnects having a first end thereof in electrical contact with a second gate of the second transistor;
   forming a volatile, resistive-switching selection device in electrical contact with a second end of the first of the conductive interconnects;
   forming a contact in electrical contact with a second end of the second of the conductive interconnects; and
   forming a metal layer overlying and in electrical contact with both the volatile selection device and the contact.

2. The method of claim 1, further comprising forming the volatile, resistive-switching selection device between a first metal line of a first BEoL metal layer, and a second BEoL metal layer.

3. The method of claim 2, further comprising forming the contact between a second metal line of the first BEoL metal layer, and the second BEoL metal layer.

4. The method of claim 2, wherein the second BEoL metal layer comprises the metal layer.

5. The method of claim 2, wherein forming the metal layer in electrical contact with both the volatile, resistive-switching selection device and the contact further comprises forming a series electrical connection between a terminal of the selection device and the contact.

6. The method of claim 1, further comprising forming the first transistor as a p-well transistor.

7. The method of claim 1, further comprising forming the second transistor as an n-well transistor.

8. The method of claim 1, wherein forming the volatile, resistive-switching selection device further comprises forming a bottom electrode from a first metal material, forming a selection layer from an insulating medium, and forming a top electrode from a second metal material.

9. The method of claim 8, further comprising selecting the insulating medium to be at least in part permeable to both the first metal material and the second metal material.

10. The method of claim 8, further comprising selecting the first metal material or the second metal material from a noble metal.

11. The method of claim 8, further comprising selecting the first metal material or the second metal material from a group consisting of: a noble metal, a noble metal alloy, Al, an Al-alloy, Cu, and a Cu-alloy.

12. The method of claim 8, further comprising forming the contact and the top electrode to have respective surfaces that share or substantially share a common plane.

13. The method of claim 12, further comprising forming the metal layer to be in electrical contact with the respective surfaces of the contact and the top electrode.

14. A non-volatile memory, comprising:
   a first three-terminal transistor having a source, a drain and a gate formed in a substrate or a dielectric of the non-volatile memory;

a volatile selection device having a first terminal, a second terminal and a selection layer, wherein the first terminal is connected electrically in serial to the gate of the first three-terminal transistor; and a second three-terminal transistor having a second source, a second drain and a second gate, wherein the second terminal of the volatile selection device is connected to the second gate of the second three-terminal transistor.

15. The non-volatile memory of claim 14, wherein the first three-terminal transistor is a p-well transistor.

16. The non-volatile memory of claim 14, wherein the second three-terminal transistor is an n-well transistor.

17. The non-volatile memory of claim 14, wherein the volatile selection device is formed at least in part among backend-of-line metal layers of the non-volatile memory.

18. The non-volatile memory of claim 14, wherein the selection layer comprises an insulating material at least in part permeable to particles of the first terminal and the second terminal, and is configured to have a low density of defect sites suitable for trapping the particles of the first terminal and the second terminal suitable to facilitate formation of a conductive filament of the particles of a few particles in width, or less.

19. The non-volatile memory of claim 14, wherein the second terminal or the first terminal is selected from a group consisting of: a noble metal, a noble metal alloy, Cu, Co, Ni, Al and Fe.

20. The non-volatile memory of claim 14, wherein the selection layer is selected from a group consisting of: SiOx, TiOx, AlOx, WOx, TixNyOz, HfOx, TaOx, NbOx where x, y, and z are positive numbers selected to provide non-stoichiometric values of oxygen or nitrogen.

* * * * *